(12) United States Patent  (10) Patent No.: US 7,901,793 B2
Kim et al.  (45) Date of Patent: Mar. 8, 2011

(54) ORGANIC LIGHT-EMITTING COMPOUND AND ORGANIC LIGHT-EMITTING DEVICE CONTAINING THE SAME

(75) Inventors: Myeong-Suk Kim, Suwon-si (KR);
Byoung-Ki Choi, Hwaseong-si (KR);
Jong-Jin Park, Yongin-si (KR);
Tae-Yong Noh, Gunpo-si (KR);
Lyong-Sun Pu, Suwon-si (KR);
Jhun-Mo Son, Yongin-si (KR);
Woon-Jung Paek, Yongin-si (KR);
Young-Mok Son, Hwaseong-si (KR);
O-Hyun Kwon, Seoul (KR); Che-Un Yang, Suwon-si (KR); Shinichiro Tamura, Seongnam-si (KR)

(73) Assignee: Samsung Mobile Display Co., Ltd., Giheung-Gu, Yongin, Gyunggi-Do (KR)

(*) Notice: Subject to any disclaimer, the term of this patent is extended or adjusted under 35 U.S.C. 154(b) by 720 days.

(21) Appl. No.: 11/525,100

(22) Filed: Sep. 22, 2006

(65) Prior Publication Data
US 2007/0072002 A1  Mar. 29, 2007

(30) Foreign Application Priority Data
Sep. 23, 2005  (KR) .......................... 10-2005-0088718
Aug. 16, 2006  (KR) .......................... 10-2006-0077128

(51) Int. Cl.
*H01L 51/54* (2006.01)
*C09K 11/06* (2006.01)
(52) U.S. Cl. ......... 428/690; 428/917; 313/504; 313/506; 585/27; 549/49; 549/220; 548/496
(58) Field of Classification Search .................. 428/690, 428/917; 313/504, 506; 257/E51; 585/27; 549/49, 220; 548/496
See application file for complete search history.

(56) References Cited

U.S. PATENT DOCUMENTS
3,172,862 A * 3/1965 Gurnee et al. ........... 252/301.16
(Continued)

FOREIGN PATENT DOCUMENTS
JP  11-003782  1/1999
(Continued)

OTHER PUBLICATIONS
Lehmann, R. B.; Daub, G. H.; Hayes, F. N.; Yguerabide, J. Org. Scintill. Liquid Scintill. Counting, Proc. Int. Conf. (1971), Meeting Date 1970, 441-57.*
Lehmann, R. B.; Daub, G. H.; Hayes, F. N.; Yguerabide, J. Org. Scintill. Liquid Scintill. Counting, Proc. Int. Conf. (1971), Meeting Date 1970, 441-57.*
(Continued)

*Primary Examiner* — D. Lawrence Tarazano
*Assistant Examiner* — J. L. Yang
(74) *Attorney, Agent, or Firm* — Robert E. Bushnell, Esq.

(57) ABSTRACT

Provided are an organic light-emitting compound of Formula 1 and an organic light-emitting device using the organic light-emitting compound:

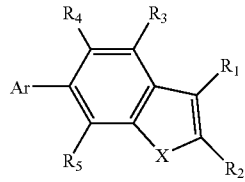

(1)

where Ar, $R_1$, $R_2$, $R_3$, $R_4$, and $R_5$ are the same as defined in the detailed description. The organic light-emitting device manufactured using the organic light-emitting compound has a low turn-on voltage and high efficiency and color purity.

19 Claims, 5 Drawing Sheets

U.S. PATENT DOCUMENTS

| | | | |
|---|---|---|---|
| 4,356,429 A | 10/1982 | Tang | |
| 6,410,562 B1* | 6/2002 | Jirousek et al. | 514/314 |
| 6,713,193 B2* | 3/2004 | Lin | 428/690 |
| 6,929,870 B2* | 8/2005 | Ishida et al. | 428/690 |
| 2003/0118866 A1* | 6/2003 | Oh et al. | 428/690 |
| 2004/0061435 A1* | 4/2004 | Liao et al. | 313/504 |
| 2004/0081853 A1* | 4/2004 | Conley | 428/690 |
| 2004/0137262 A1* | 7/2004 | Lin | 428/690 |
| 2004/0146746 A1 | 7/2004 | Lee et al. | 428/690 |
| 2005/0233166 A1* | 10/2005 | Ricks et al. | 428/690 |
| 2007/0224448 A1* | 9/2007 | Ikeda et al. | 428/690 |

FOREIGN PATENT DOCUMENTS

| | | |
|---|---|---|
| JP | 2000-091075 | 3/2000 |
| JP | 2003-146951 | 5/2003 |
| JP | 2004-091334 | 3/2004 |
| JP | 2005-047868 | 2/2005 |

OTHER PUBLICATIONS

Machine translation of JP2000-091075. Date of publication: Mar. 31, 2000.

Machine translation of JP2003-146951. Date of publication: May 21, 2003.

Machine translation of JP2005-047868. Date of publication: Feb. 24, 2005.

Kuwabara et al. "Thermally Stable Multilayered Organic Electroluminescent Devices Using Novel Starburst Molecules, 4,4'4"-Tri(N-carbazolyl)triphenylamine (TCTA) and 4,4'4"-Tri(3-methylphenylphenyl-amino) triphenylamine(m-MTDATA), as Hole-Transport Materials", Adv. Mater. 1994, 6, No. 9, pp. 677-679.

Chinese Office Action issued by the Chinese Patent Office dispatched Jun. 10, 2010, Application No. 200610063977.3 and File No. 2010060700403550 together with English translation.

* cited by examiner

ORGANIC LIGHT-EMITTING COMPOUND AND ORGANIC LIGHT-EMITTING DEVICE CONTAINING THE SAME

CLAIM OF PRIORITY

This application claims the benefit of Korean Patent Application No. 10-2005-0088718, filed on Sep. 23, 2005, and Korean Patent Application No. 10-2006-0077128, filed on Aug. 16, 2006, in the Korean Intellectual Property Office, the disclosures of which are incorporated herein in their entirety by reference.

BACKGROUND OF THE INVENTION

1. Field of the Invention

The present invention relates to an organic light-emitting compound, and an organic light-emitting device using the organic light-emitting compound, and more particularly, to an organic light-emitting compound that has excellent electrical characteristics, thermal stability and photochemical stability, and provides a low turn-on voltage and excellent color purity characteristics when used in an organic light-emitting device, and an organic light-emitting device with an organic layer containing the organic light-emitting compound.

2. Description of the Related Art

Light-emitting diodes, which are self-emissive devices, have the advantages of a large viewing angle, a high contrast, and a short response time. Light-emitting diodes can be classified into inorganic light-emitting diodes using an inorganic compound in their emitting layer and organic light-emitting diodes (OLEDs) using an organic compound in their emitting layer. OLEDs have higher brightness, lower driving voltage, and shorter response time than inorganic light-emitting diodes and can achieve full color display. Due to these advantages of OLEDs, much research into OLEDs has been performed.

OLEDs have a stacked structure including an anode, an organic light-emitting layer, and a cathode. OLEDs can have various structures including, for example, a stack of an anode, a hole injecting layer, a hole transporting layer, an emitting layer, an electron transporting layer, an electron injecting layer, and a cathode, a stack of an anode, a hole injecting layer, a hole transporting layer, an emitting layer, a hole blocking layer, an electron transporting layer, an electron injecting layer, and a cathode, etc.

Materials used to form an organic layer of an organic light-emitting device can be classified into either materials suitable for vacuum deposition or materials suitable for liquid coating according to a method used to form the organic layer. Materials suitable for vacuum deposition may be low-molecular weight materials having a vapor pressure of $10^{-6}$ torr or greater at 500° C. or lower. Materials suitable for liquid coating should be highly soluble in a solvent so as to be used in a liquid form and have an aromatic or complex ring.

When an organic light-emitting device is manufactured using vacuum deposition, due to the use of a vacuum system, the manufacturing costs increase. Furthermore, when a shadow mask is used to form pixels for full-color display, the resolution of the pixels is not sufficiently high. Meanwhile, when a liquid coating method, such as inkjet printing, screen printing, spin coating, etc., is used, the manufacturing processes are easy, and a higher resolution than when using a shadow mask can be obtained.

However, materials which are compatible with liquid coating, and in particular, blue luminescent materials, are inferior to materials which are compatible with vacuum deposition, in terms of thermal stability, color purity, etc. However, even when a material, which is compatible with liquid coating, with excellent performance is formed as an organic layer, the material is crystallized with a crystal size that can scatter visible light, which may cause white turbidity and leads to pin holes in the organic layer, thereby causing deterioration in the device.

Japanese Patent Laid-open No. 1999-003782 discloses anthracene substituted with two naphthyl groups as a compound that can be used in an emitting layer or a hole injecting layer. However, the compound has poor solubility in a solvent, and the characteristics of an organic light-emitting device containing the compound are not satisfactory.

Thus, there still is a need to develop an organic light-emitting device with improvements in turn-on voltage, luminance, efficiency and color purity characteristics using a blue luminescent material that has a high thermal stability and can form an organic layer with excellent properties.

SUMMARY OF THE INVENTION

The present invention provides an organic light-emitting compound with excellent solubility and thermal stability.

The present invention provides an organic light-emitting device with improvements in turn-on voltage, efficiency and color purity characteristics.

According to an aspect of the present invention, there is provided an organic light-emitting compound represented by Formula 1 below:

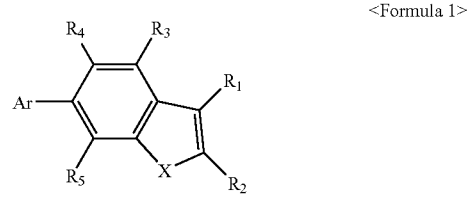

<Formula 1> where Ar is a substituted or unsubstituted $C_6$-$C_{50}$ aryl group;

each of $R_1$, $R_2$, $R_3$, $R_4$, and $R_5$ is independently selected from the group consisting of hydrogen, a halogen atom, a cyano group, a nitro group, a hydroxyl group, a substituted or unsubstituted $C_1$-$C_{50}$ alkyl group, a substituted or unsubstituted $C_1$-$C_{50}$ alkoxy group, a substituted or unsubstituted $C_5$-$C_{50}$ cycloalkyl group, a substituted or unsubstituted $C_5$-$C_{50}$ heterocycloalkyl group, a substituted or unsubstituted $C_6$-$C_{50}$ aryl group, a substituted or unsubstituted $C_2$-$C_{50}$ heteroaryl group, —N($Z_1$)($Z_2$), and —Si($Z_3$)($Z_4$)($Z_5$), wherein each of $Z_1$, $Z_2$, $Z_3$, $Z_4$, and $Z_5$ is independently selected from the group consisting of hydrogen, a substituted or unsubstituted $C_1$-$C_{50}$ alkyl group, a substituted or unsubstituted $C_6$-$C_{50}$ aryl group, a substituted or unsubstituted $C_2$-$C_{50}$ heteroaryl group, a substituted or unsubstituted $C_5$-$C_{50}$ cycloalkyl group, and a substituted or unsubstituted $C_5$-$C_{50}$ heterocycloalkyl group, and $R_2$ is not an anthracene group; and X is selected from the group consisting of $C(Z_6)(Z_7)$, $N(Z_8)$, O, S, $SO_2$, Se, and $SeO_2$ wherein each of $Z_6$, $Z_7$, and $Z_8$ is independently hydrogen, a substituted or unsubstituted $C_1$-$C_{50}$ alkyl group, or a substituted or unsubstituted $C_6$-$C_{50}$ aryl group.

According to another aspect of the present invention, there is provided an organic light-emitting device comprising: a first electrode; a second electrode; and at least one organic layer interposed between the first and second electrodes, the organic layer containing the above-described organic light-emitting compound.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
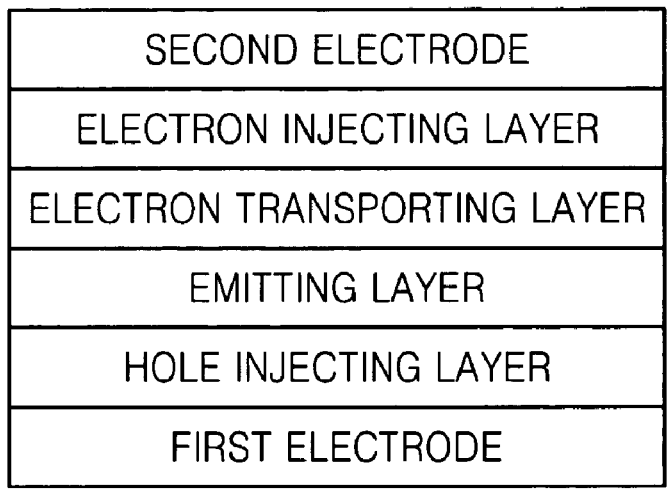
FIGS. 1A through 1C illustrate structures of organic light-emitting devices as electronic devices according to embodiments of the present invention.

Hereinafter, the present invention will be described in detail

An organic light-emitting compound according to an embodiment of the present invention is represented by Formula 1 below:

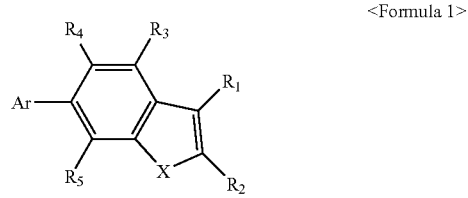

<Formula 1> where Ar is a substituted or unsubstituted $C_6$-$C_{50}$ aryl group;

each of $R_1$, $R_2$, $R_3$, $R_4$, and $R_5$ is independently selected from the group consisting of hydrogen, a halogen atom, a cyano group, a nitro group, a hydroxyl group, a substituted or unsubstituted $C_1$-$C_{50}$ alkyl group, a substituted or unsubstituted $C_1$-$C_{50}$ alkoxy group, a substituted or unsubstituted $C_5$-$C_{50}$ cycloalkyl group, a substituted or unsubstituted $C_5$-$C_{50}$ heterocycloalkyl group, a substituted or unsubstituted $C_6$-$C_{50}$ aryl group, a substituted or unsubstituted $C_2$-$C_{50}$ heteroaryl group, —$N(Z_1)(Z_2)$, and —$Si(Z_3)(Z_4)(Z_5)$, wherein each of $Z_1$, $Z_2$, $Z_3$, $Z_4$, and $Z_5$ is independently selected from the group consisting of hydrogen, a substituted or unsubstituted $C_1$-$C_{50}$ alkyl group, a substituted or unsubstituted $C_6$-$C_{50}$ aryl group, a substituted or unsubstituted $C_2$-$C_{50}$ heteroaryl group, a substituted or unsubstituted $C_5$-$C_{50}$ cycloalkyl group, and a substituted or unsubstituted $C_5$-$C_{50}$ heterocycloalkyl group, and $R_2$ is not an anthracene group; and X is selected from the group consisting of $C(Z_6)(Z_7)$, $N(Z_8)$, O, S, $SO_2$, Se, and $SeO_2$ wherein each of $Z_6$, $Z_7$, and $Z_8$ is independently hydrogen, a substituted or unsubstituted $C_1$-$C_{50}$ alkyl group, or a substituted or unsubstituted $C_6$-$C_{50}$ alkyl group.

In Formula 1, Ar and the heteroaryl group connected thereto increase the thermal stability and the photochemical stability of the compound of Formula 1. The substituent groups $R_1$ through $R_5$ improve the solubility and amorphous property of the compound of Formula 1, thereby improving the film processiblity of the compound of Formula 1. The compound of Formula 1 is suitable as a material forming an organic layer interposed between first and second electrodes in an organic light-emitting device. The compound of Formula 1 is suitable as a material for an organic layer, and in particular, an emitting layer, a hole injecting layer or a hole transporting layer, in an organic light-emitting device, and can be used as a host material and/or a dopant material.

The organic light-emitting compound may have a structure of Formula 2 or 3 below.

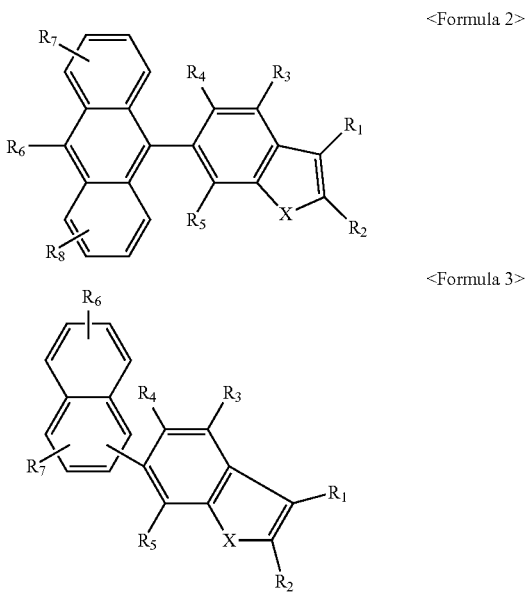

<Formula 2>

<Formula 3>

In Formulae 2 and 3 above, each of $R_1$, $R_2$, $R_3$, $R_4$, $R_5$, $R_6$, $R_7$, and $R_8$ is cyano group, a nitro group, a hydroxyl group, a substituted or unsubstituted $C_1$-$C_{20}$ alkyl group, a substituted or unsubstituted $C_1$-$C_{50}$ alkoxy group, a substituted or unsubstituted $C_5$-$C_{50}$ cycloalkyl group, a substituted or unsubstituted $C_5$-$C_{50}$ heterocycloalkyl group, a substituted or unsubstituted $C_6$-$C_{50}$ aryl group, a substituted or unsubstituted $C_2$-$C_{50}$ heteroaryl group, —$N(Z_1)(Z_2)$, and —$Si(Z_3)(Z_4)(Z_5)$, wherein each or unsubstituted $C_2$-$C_{50}$ heteroaryl group, —$N(Z_1)(Z_2)$, and —$Si(Z_3)(Z_4)(Z_5)$, wherein each hydrogen, a substituted or unsubstituted $C_1$-$C_{50}$ alkyl group, a substituted or unsubstituted $C_6$-$C_{50}$ aryl group, a substituted or unsubstituted $C_2$-$C_{50}$ heteroaryl group, a substituted or unsubstituted $C_5$-$C_{50}$ cycloalkyl group, and a substituted or unsubstituted $C_5$-$C_{50}$ heterocycloalkyl group, and $R_2$ is not an anthracene group; and X is selected from the group consisting of $C(Z_6)(Z_7)$, $N(Z_8)$, O, S, $SO_2$, Se, and $SeO_2$ wherein each of $Z_6$, $Z_7$, and $Z_8$ is independently hydrogen, a substituted or unsubstituted $C_1$-$C_{20}$ alkyl group, or a substituted or unsubstituted $C_6$-$C_{50}$ alkyl group.

The aryl group is an aromatic cyclic system with a monovalent group, the system including at least two rings which are attached together or are fused as well as a single ring. The heteroaryl group means a group including at least one carbon substituted with at least one substituent such as N, O, S, and P. The cycloalkyl group means an alkyl group with a ring. The heterocycloalkyl group means a group including at least one carbon substituted with at least one substituent such as N, O, S, and P.

The substituted alkyl group, the substituted alkoxy group, the substituted aryl group, the substituted heteroaryl group, the substituted cycloalkyl group, and the substituted heterocycloalkyl group may have at least one substituent selected from the group consisting of —F; —Cl; —Br; —CN; —NO$_2$; —OH; an unsubstituted C$_1$-C$_{50}$ alkyl group or a C$_1$-C$_{50}$ alkyl group substituted with —F, —Cl, —Br, —CN, —NO$_2$, or —OH; an unsubstituted C$_1$-C$_{50}$ alkoxy group or a C$_1$-C$_{50}$ alkoxy group substituted with —F, —Cl, —Br, —CN, —NO$_2$, or —OH; an unsubstituted C$_6$-C$_{50}$ aryl group or a C$_6$-C$_{50}$ aryl group substituted with a C$_1$-C$_{50}$alkyl group, a C$_1$-C$_{50}$alkoxy group, —F, —Cl, —Br, —CN, —NO$_2$, or —OH; an unsubstituted C$_2$-C$_{50}$ heteroaryl group or a C$_2$-C$_{50}$ heteroaryl group substituted with a C$_1$-C$_{50}$alkyl group, a C$_1$-C$_{50}$alkoxy group, —F, —Cl, —Br, —CN, —NO$_2$, or —OH; an unsubstituted C$_5$-C$_{50}$ cycloalkyl group or a C$_5$-C$_{50}$ cycloalkyl group substituted with a C$_1$-C$_{50}$alkyl group, a C$_1$-C$_{50}$alkoxy group, —F, —Cl, —Br, —CN, —NO$_2$, or —OH; an unsubstituted C$_5$-C$_{50}$ heterocycloalkyl group or a C$_5$-C$_{50}$ heterocycloalkyl group substituted with a C$_1$-C$_{50}$alkyl group, a C$_1$-C$_{50}$alkoxy group, —F, —Cl, —Br, —CN, —NO$_2$, or —OH; and —N(Z$_9$)(Z$_{10}$), wherein each of Z$_9$ and Z$_{10}$ is independently selected from the group consisting of hydrogen, a C$_1$-C$_{50}$alkyl group; and a C$_6$-C$_{50}$aryl group substituted with a C$_1$-C$_{50}$ alkyl group.

Preferably, in Formulae 1 through 3 above, each of R$_1$, R$_2$, R$_3$, R$_4$, R$_5$, R$_6$, R$_7$, and R$_8$ is independently selected from the group consisting of hydrogen, a C$_1$-C$_{50}$ alkyl group, a C$_1$-C$_{50}$ alkoxy group, a phenyl group, a biphenyl group, a pentalenyl group, an indenyl group, a naphthyl group, a biphenylenyl group, an anthracenyl group, an azulenyl group, a heptalenyl group, an acenaphthylenyl group, a phenalenyl group, a fluorenyl group, a methylanthryl group, a phenanthrenyl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, a carbazolyl group, a thiophenyl group, an indolyl group, a purinyl group, a benzimidazolyl group, a quinolinyl group, a benzothiophenyl group, a parathiazinyl group, a pyrrolyl group, a pyrazolyl group, an imidazolyl group, an imidazolinyl group, an oxazolyl group, a thiazolyl group, a triazolyl group, a tetrazolyl group, an oxadiazolyl group, a pyridinyl group, a pyridazinyl group, a pyrimidinyl group, a pyrazinyl group, a thianthrenyl group, a cyclopentyl group, a cyclohexyl group, an oxiranyl group, a pyrrolidinyl group, a pyrazolidinyl group, an imidazolidinyl group, a piperidinyl group, a pyrazinyl group, a morpholinyl group, a di(C$_6$-C$_{50}$ aryl)amino group, a tri(C$_6$-C$_{50}$aryl)silyl group, and a derivative thereof.

Throughout the specification, the term "derivative" refers to a group including at least one hydrogen substituted with such a substituent as described above.

In an embodiment of the present invention, each of R$_1$, R$_2$, R$_3$, R$_4$, R$_5$, R$_6$, R$_7$, and R$_8$ may be a methyl group, a methoxy group, a phenyl group, a tolyl group, a naphthyl group, a pyrenyl group, a phenanthrenyl group, a fluorenyl group, an imidazolinyl group, an indolyl group, a quinolinyl group, a diphenylamino group, a 2,3-di-p-tolylaminopheny group, a triphenylsilyl group, and a derivative thereof.

As described above, X in Formulae 2 and 3 is C(Z$_6$)(Z$_7$), N(Z$_8$), O, S, SO$_2$, As described above, X in Formulae 2 and 3 is C(Z$_6$)(Z$_7$), N(Z$_8$), O, S, SO$_2$, unsubstituted C$_1$-C$_{50}$alkyl group, or a substituted or unsubstituted C$_6$-C$_{50}$aryl group. X may be CH$_2$, C(CH$_3$)$_2$, C(C$_6$H$_5$)$_2$, N—CH$_3$, N—(C$_6$H$_5$)$_2$, O, S, or SO$_2$.

Organic light-emitting compounds according to embodiments of the present invention may have structures represented by Formulae 4 through 100 below, but are not limited to thereto.

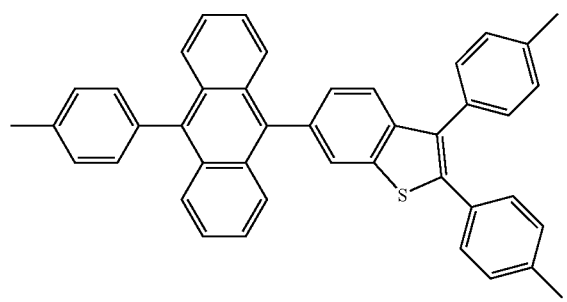

<Formula 4>

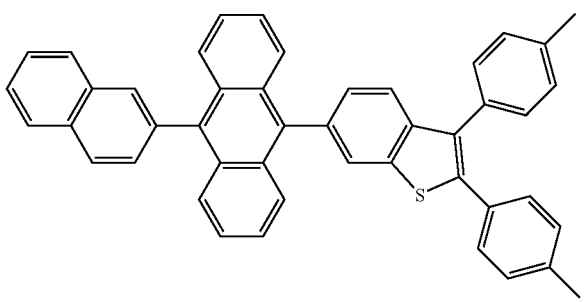

<Formula 5>

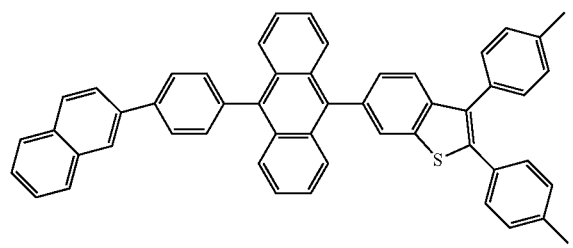

<Formula 6>

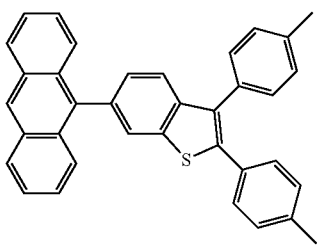

<Formula 7>

<Formula 8>
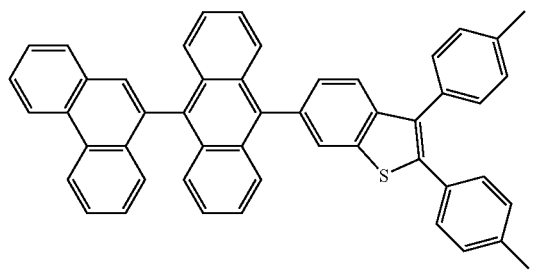
<Formula 9>
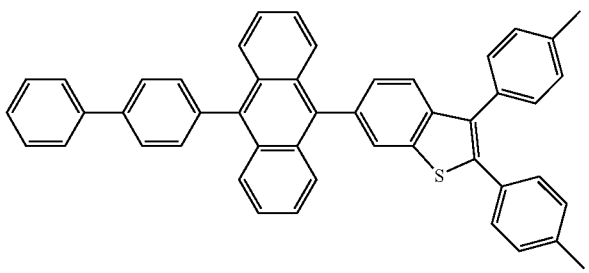
<Formula 10>
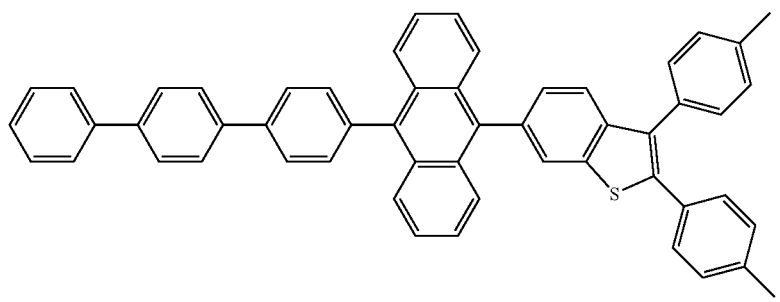
<Formula 11>
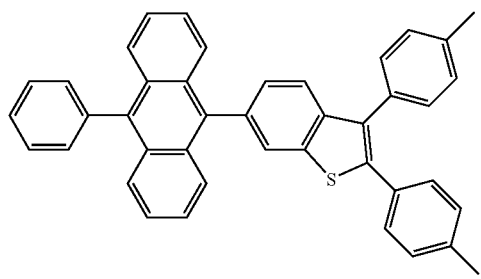
<Formula 12>
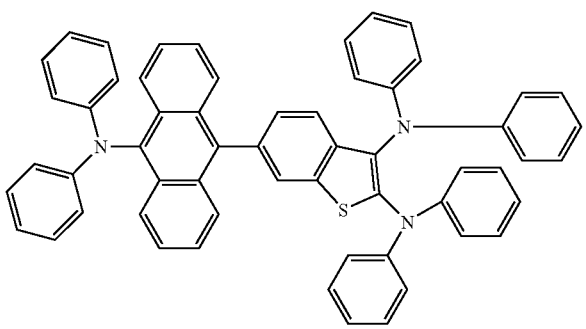
<Formula 13>
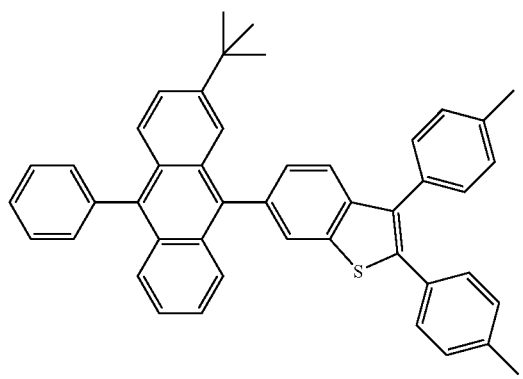

-continued
<Formula 14>
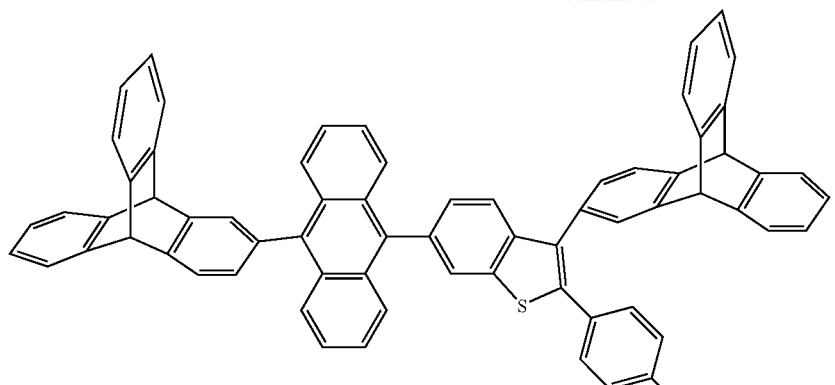
<Formula 15>
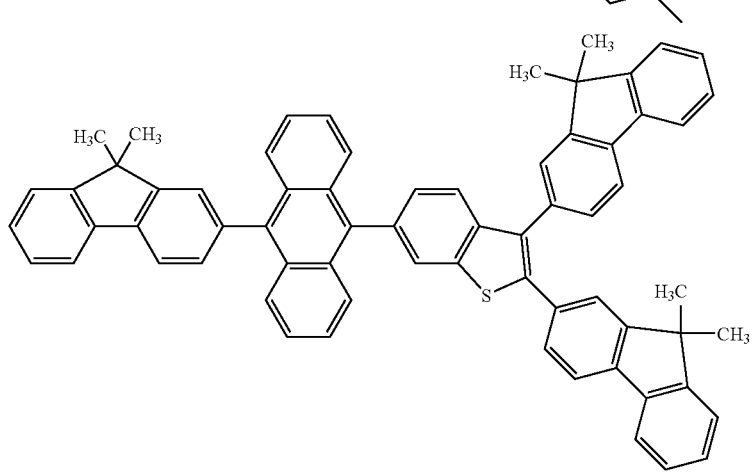
<Formula 16>
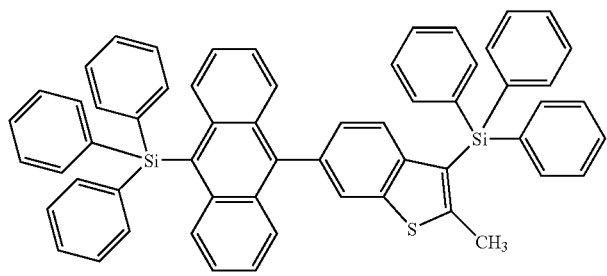
<Formula 17>
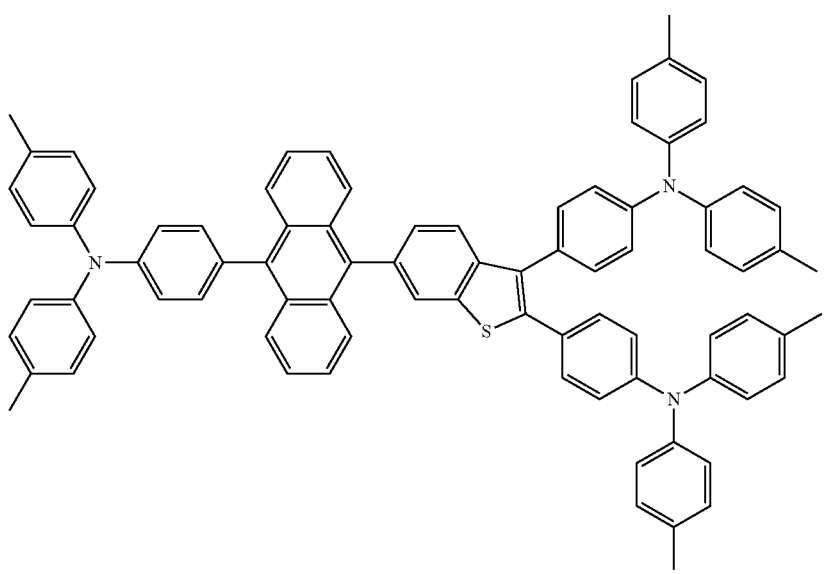

-continued
<Formula 18>
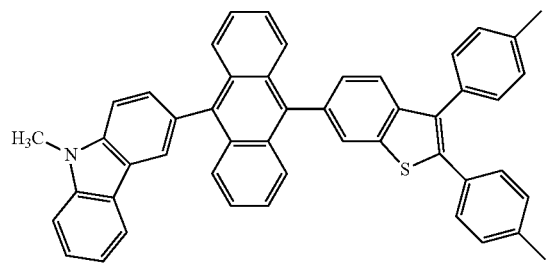
<Formula 19>
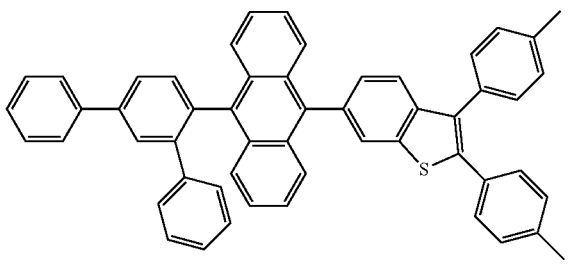
<Formula 20>
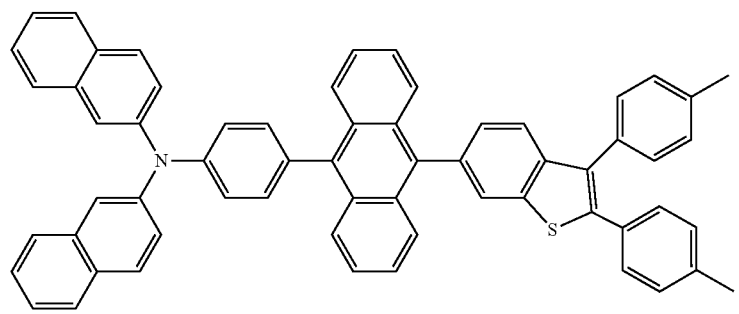
<Formula 21>
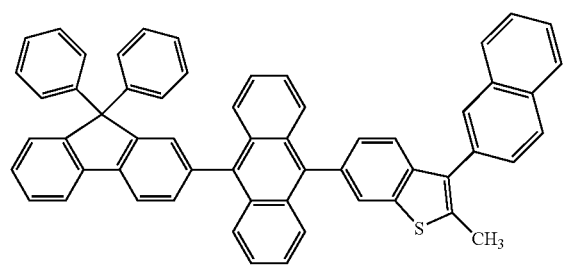
<Formula 22>
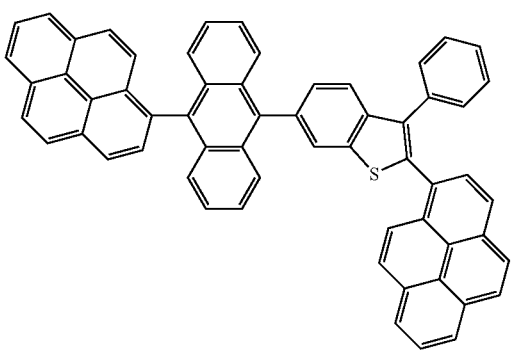
<Formula 23>
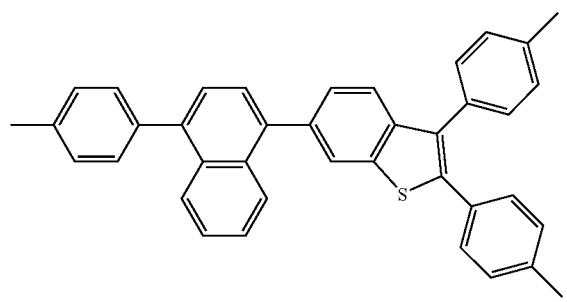
<Formula 24>
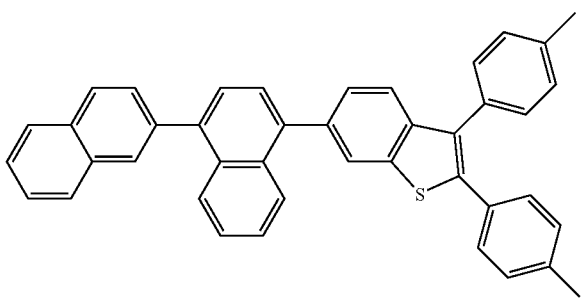
<Formula 25>
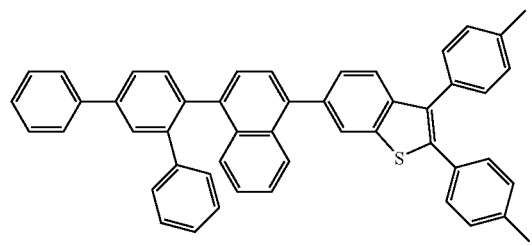
<Formula 26>
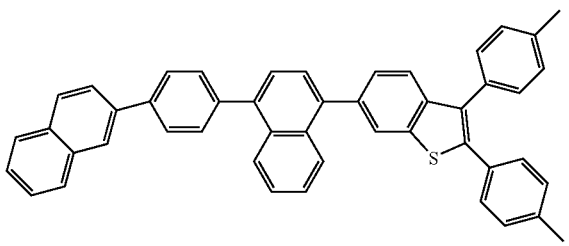

-continued
<Formula 27>
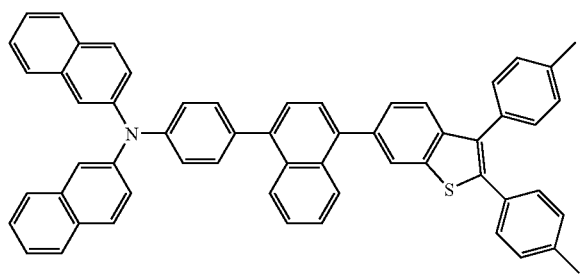
<Formula 28>
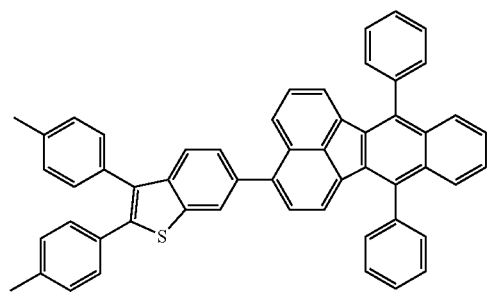
<Formula 29>
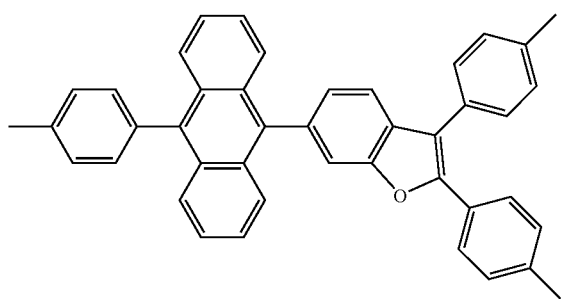
<Formula 30>
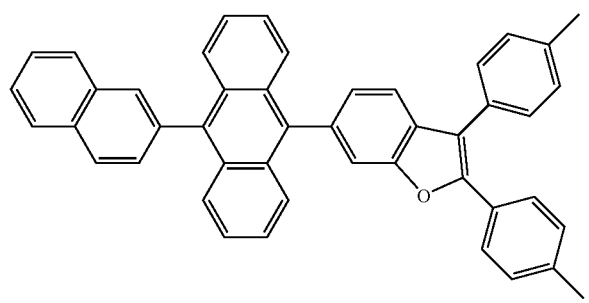
<Formula 31>
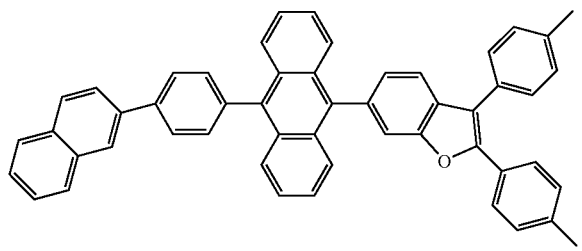
<Formula 32>
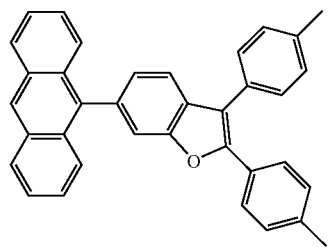
<Formula 33>
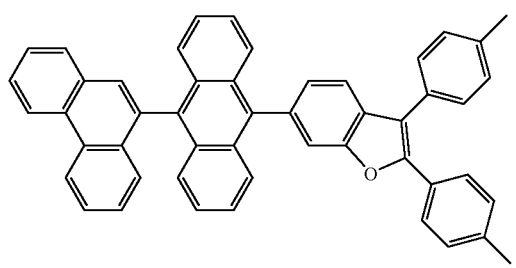
<Formula 34>
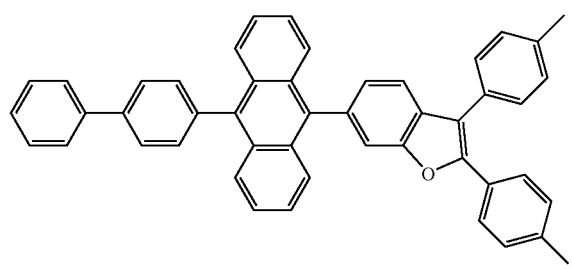
<Formula 35>
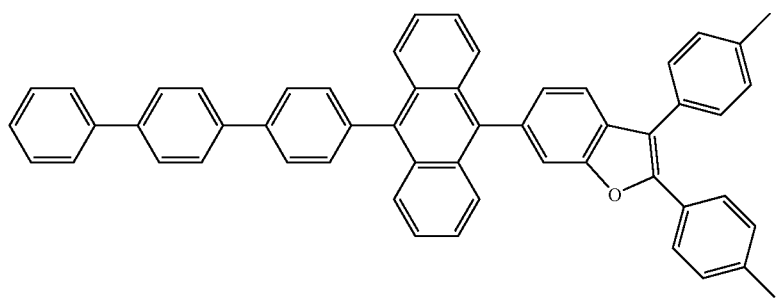

<Formula 36>
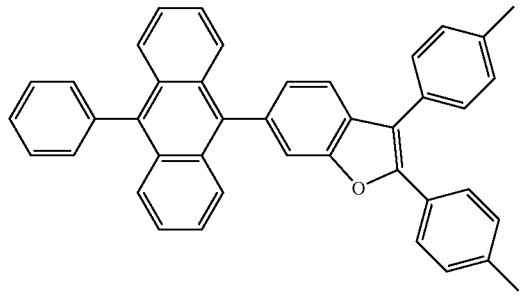
<Formula 37>
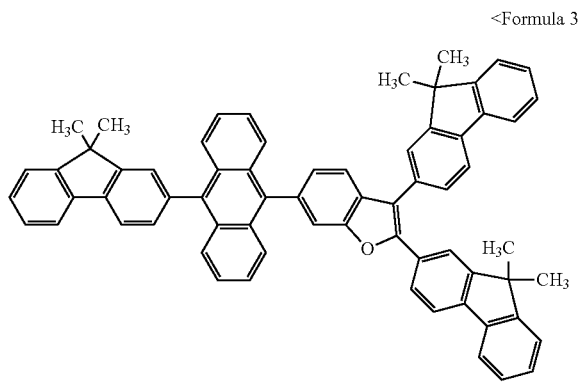
<Formula 38>
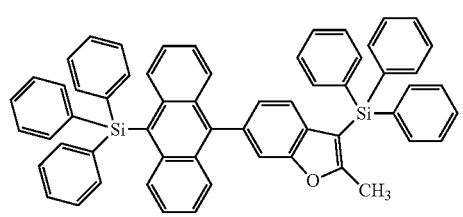
<Formula 39>
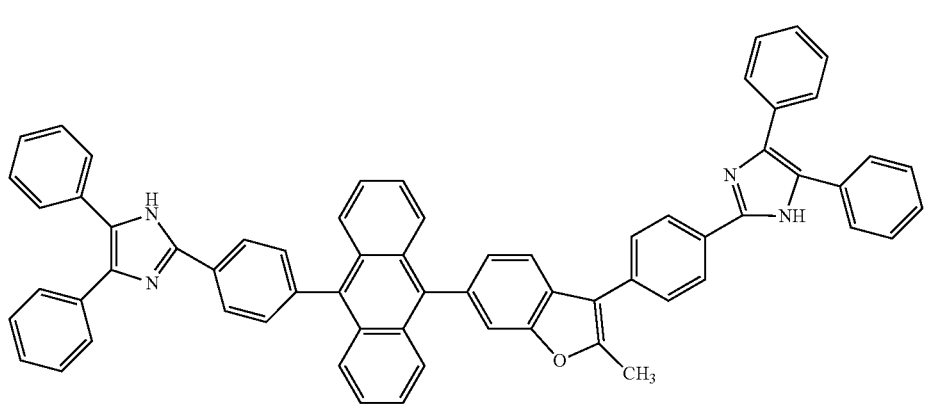
<Formula 40>
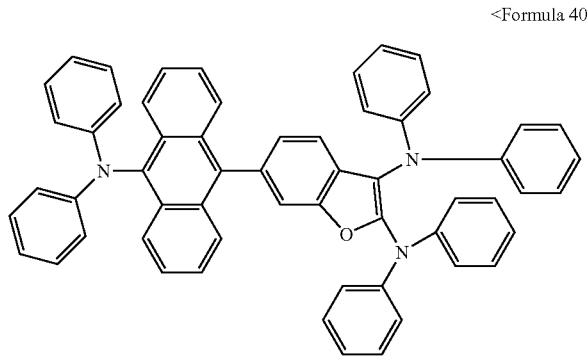
<Formula 41>
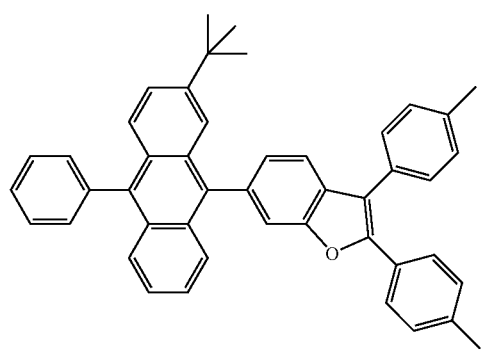

<Formula 42>
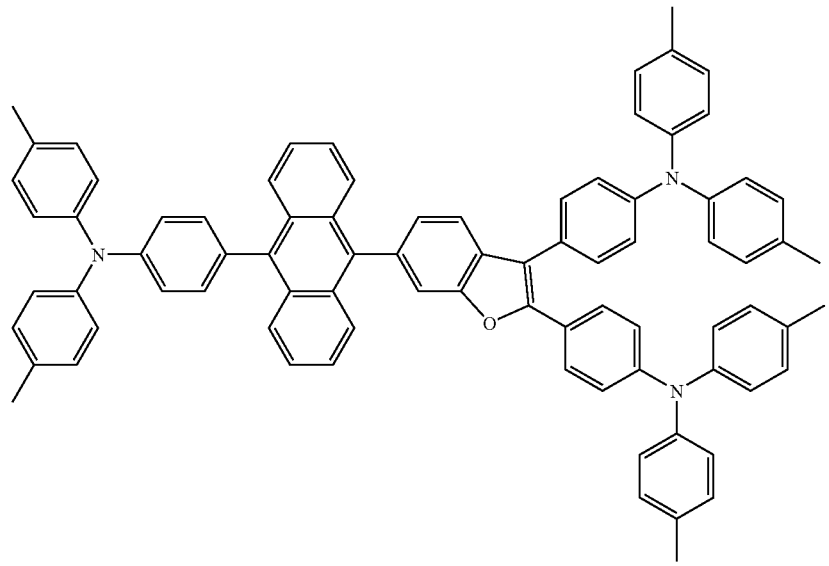
<Formula 43>
<Formula 44>
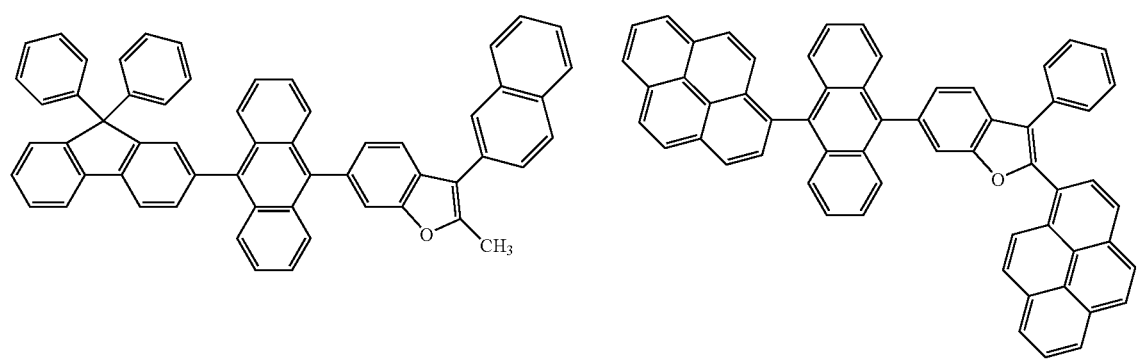
<Formula 45>
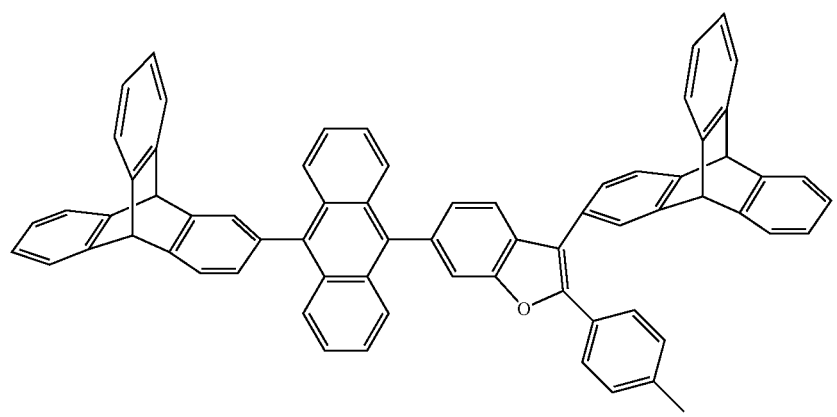
<Formula 46>
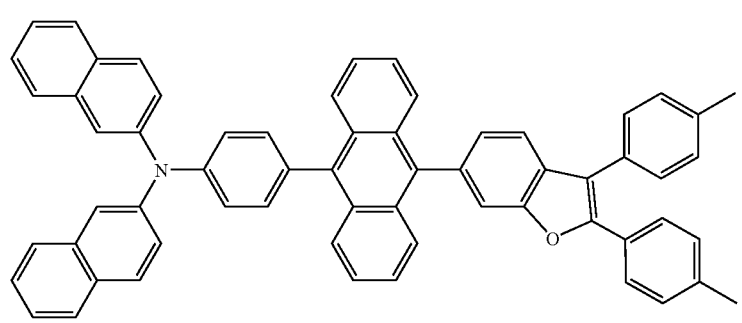

-continued
<Formula 47>
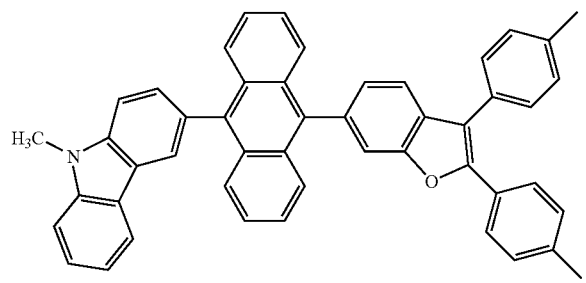
<Formula 48>
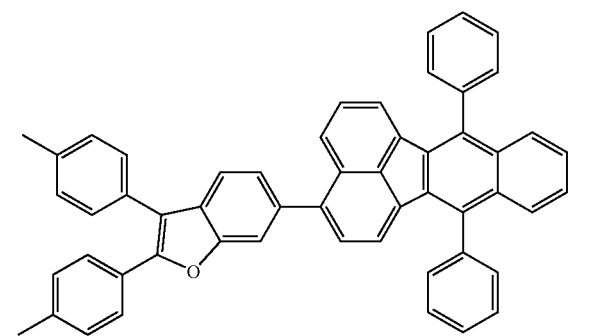
<Formula 49>
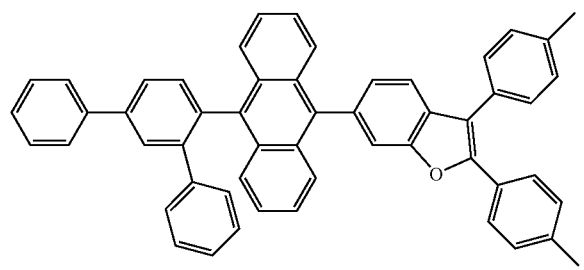
<Formula 50>
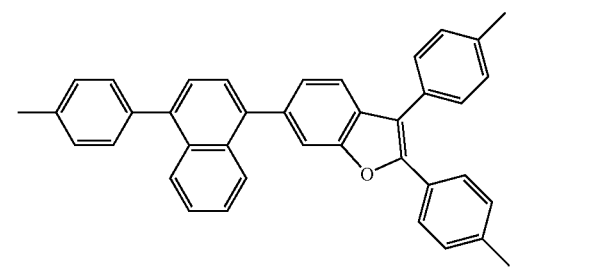
<Formula 51>
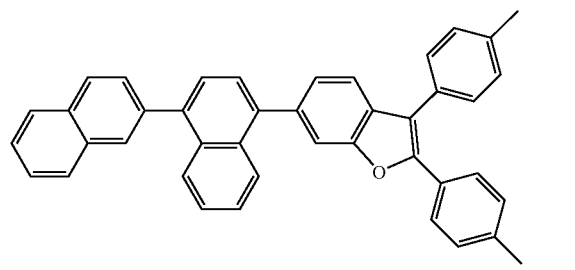
<Formula 52>
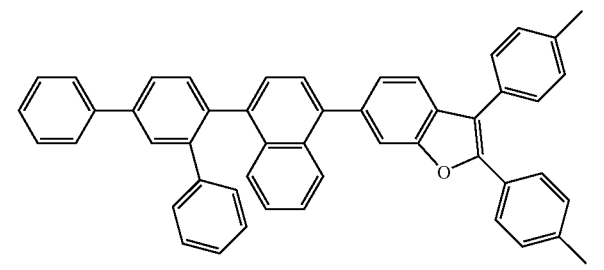
<Formula 53>
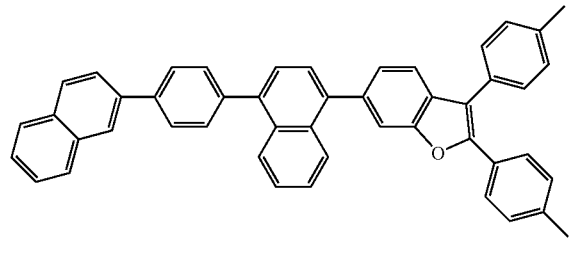
<Formula 54>
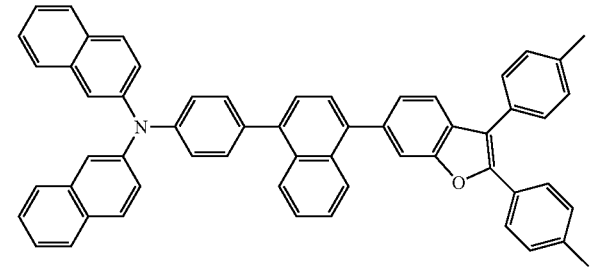
<Formula 55>
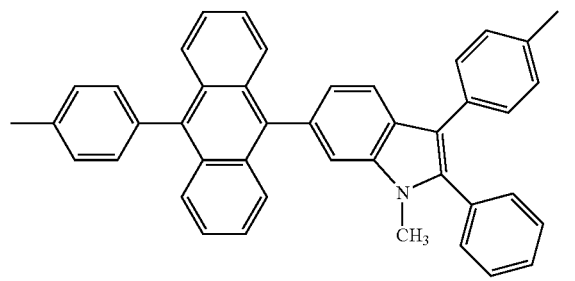
<Formula 56>
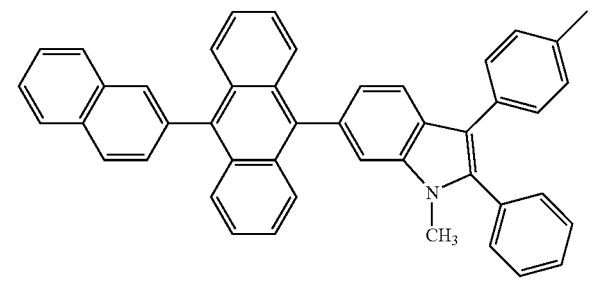

-continued
<Formula 57>
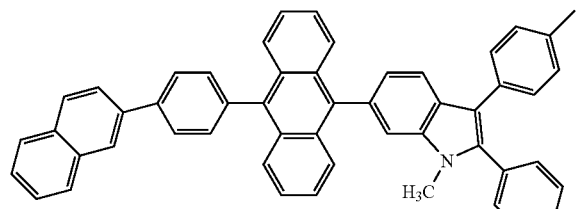
<Formula 58>
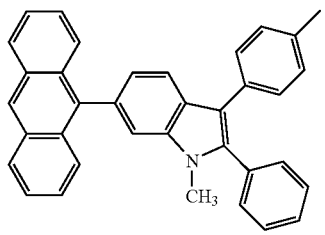
<Formula 59>
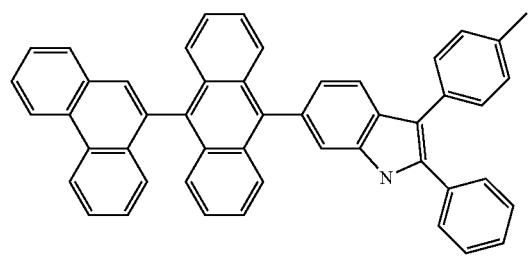
<Formula 60>
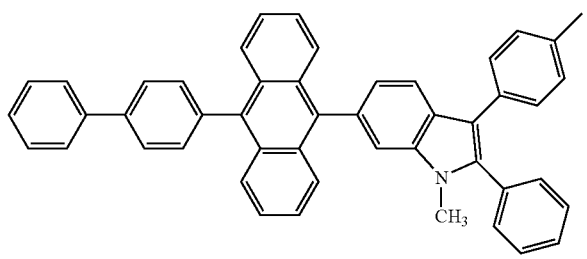
<Formula 61>
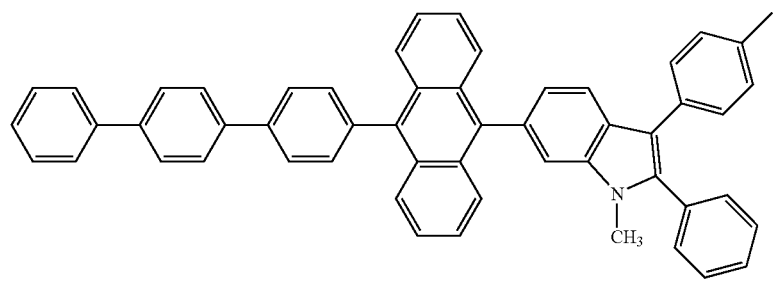
<Formula 62>
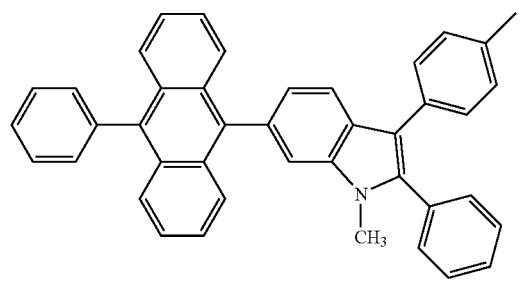
<Formula 63>
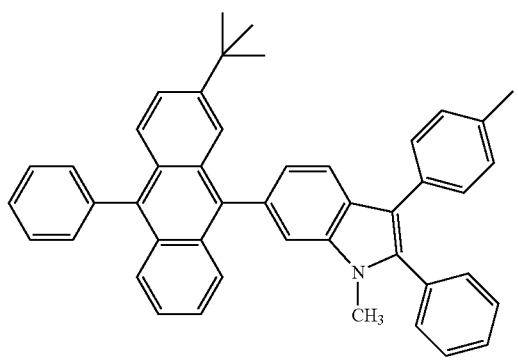
<Formula 64>
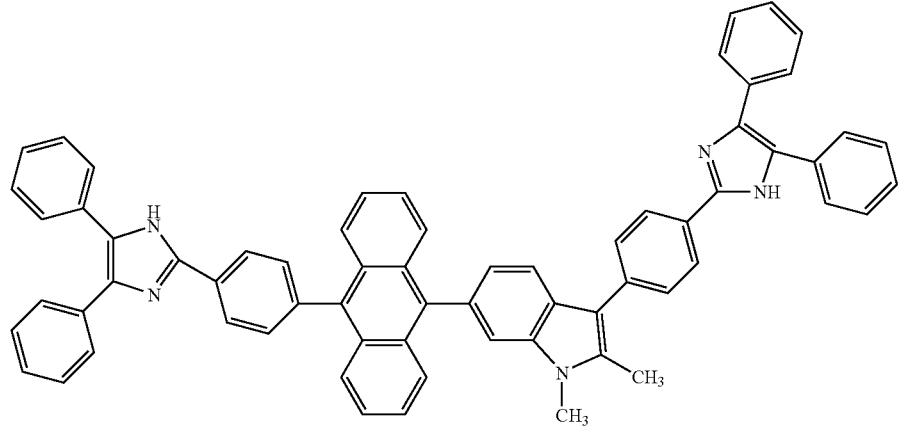

-continued
<Formula 65>
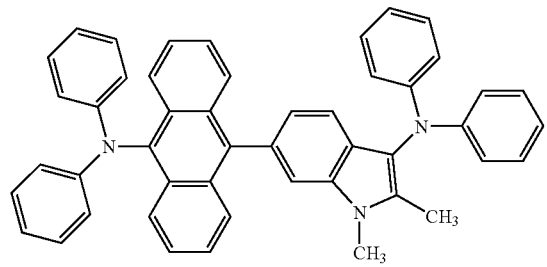
<Formula 66>
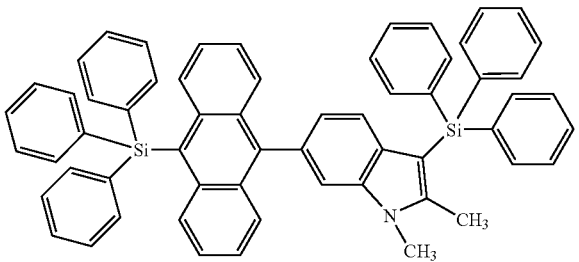
<Formula 67>
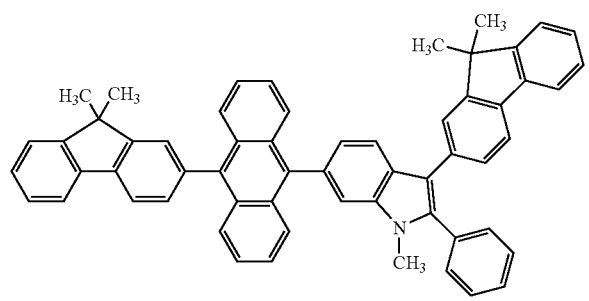
<Formula 68>
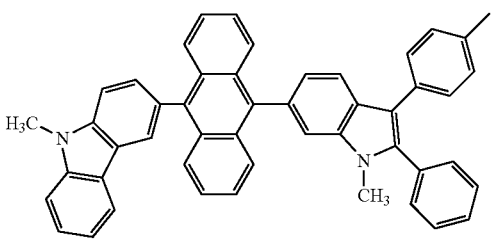
<Formula 69>
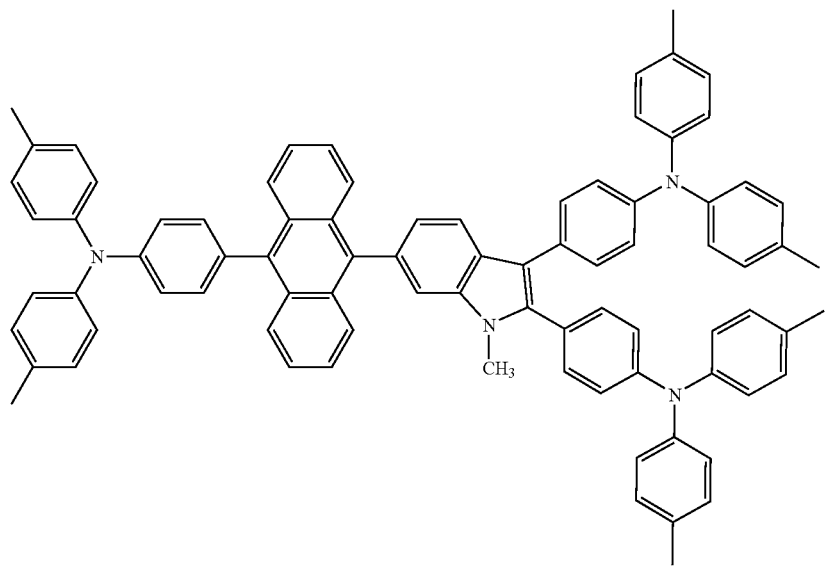
<Formula 70>
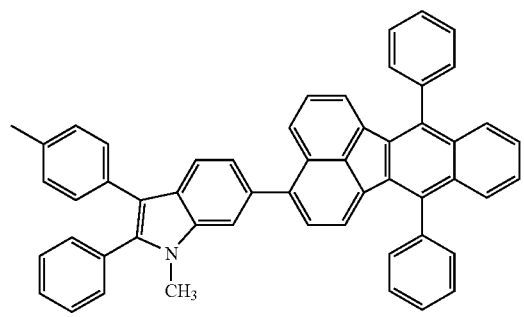
<Formula 71>
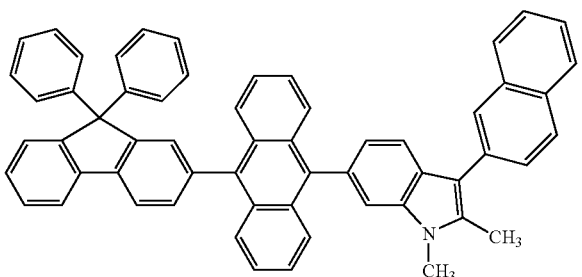

-continued
<Formula 72>
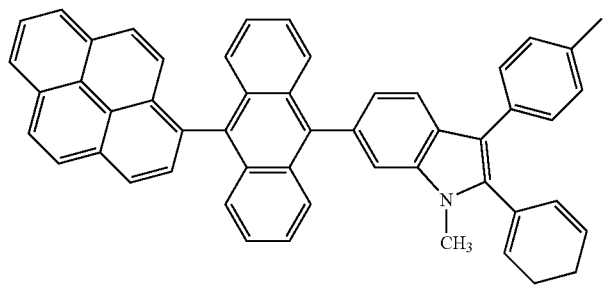
<Formula 73>
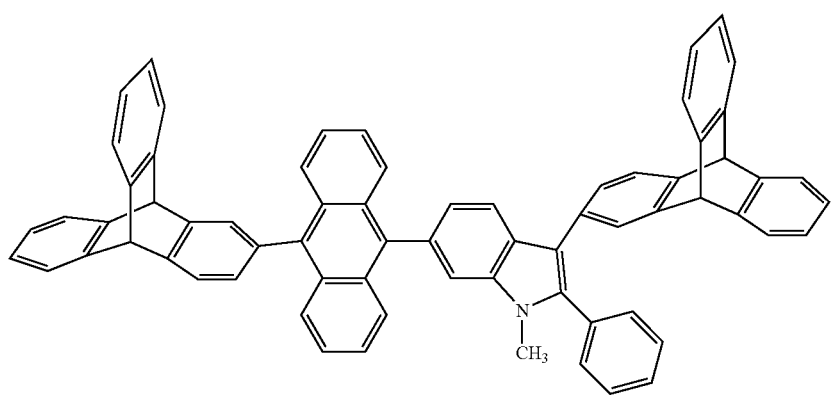
<Formula 74>
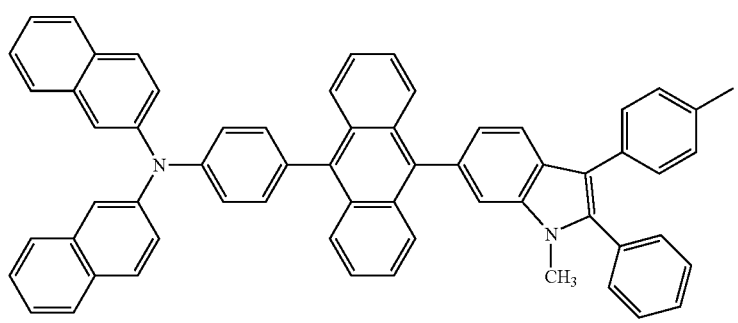
<Formula 75>
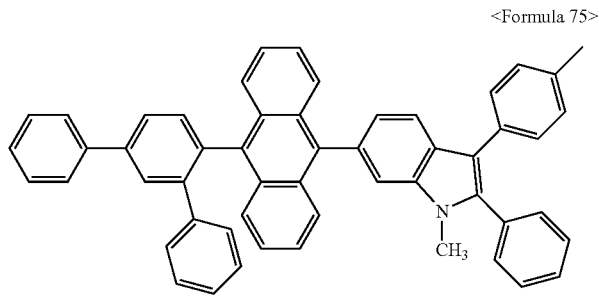
<Formula 76>
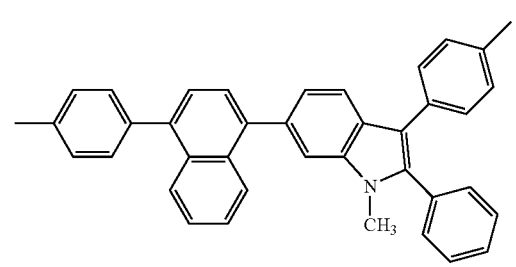
<Formula 77>
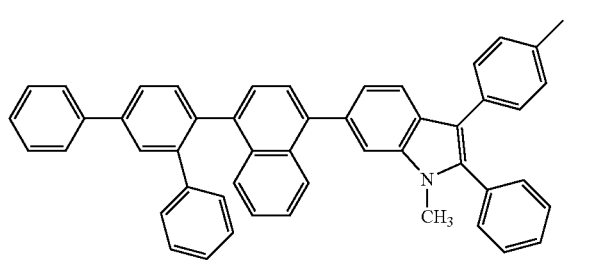
<Formula 78>
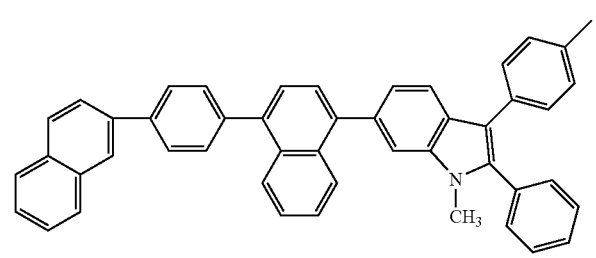

-continued
<Formula 79>
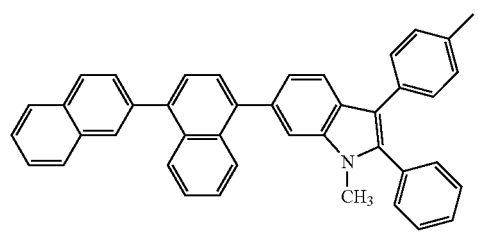
<Formula 80>
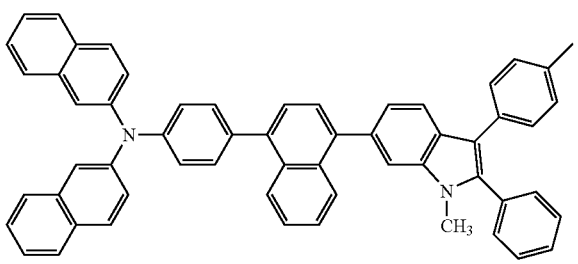
<Formula 81>
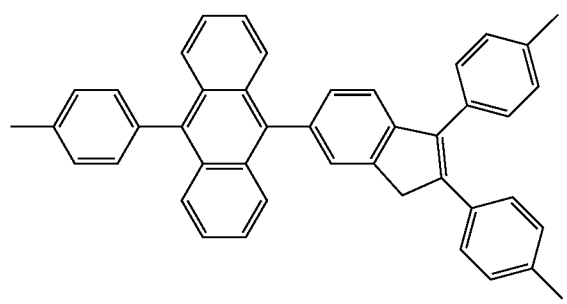
<Formula 82>
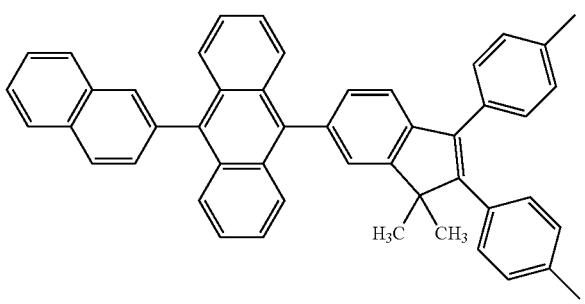
<Formula 83>
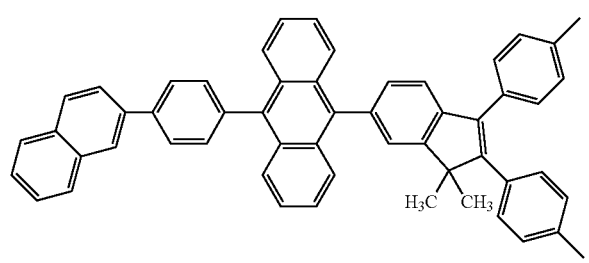
<Formula 84>
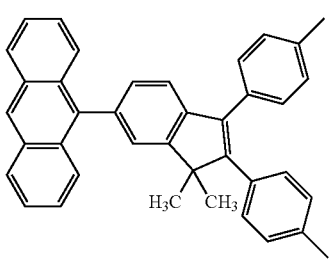
<Formula 85>
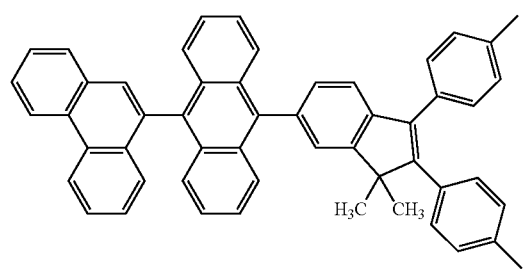
<Formula 86>
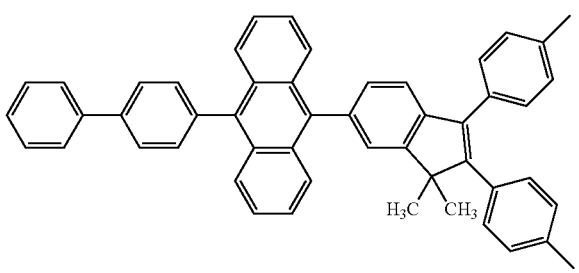
<Formula 87>
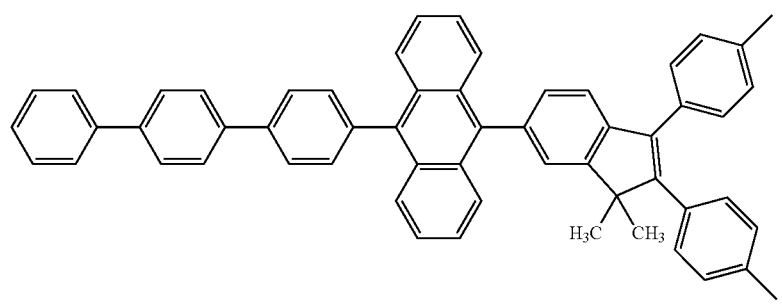

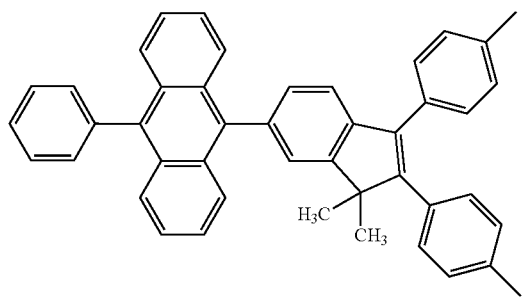
<Formula 88>
<Formula 89>
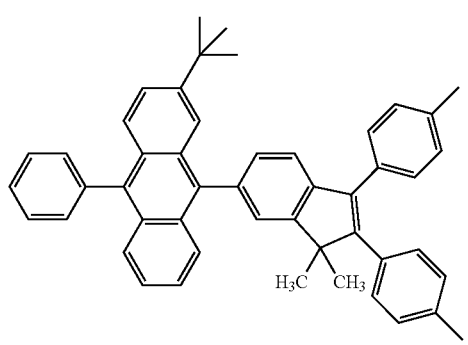
<Formula 90>
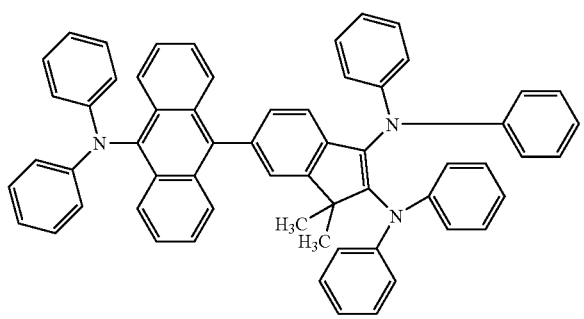
<Formula 91>
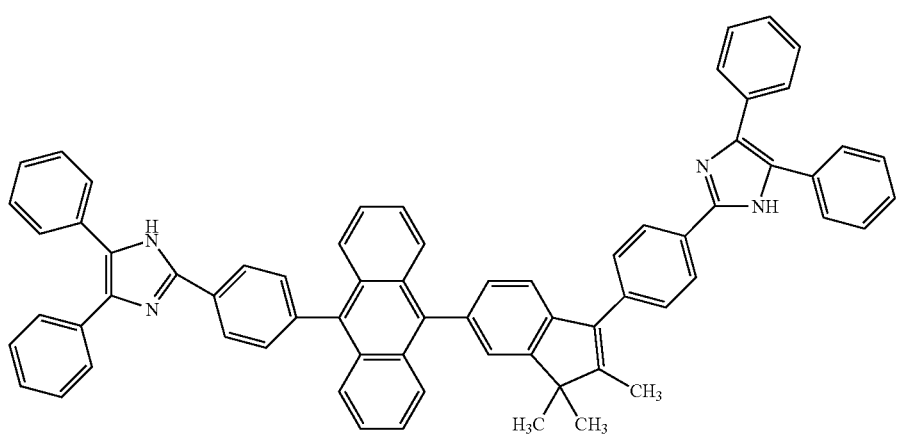
<Formula 92>
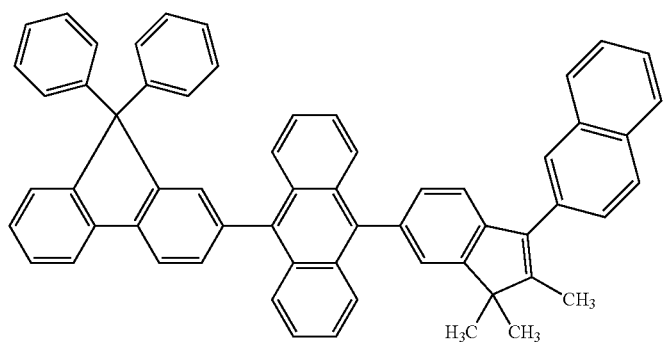

<Formula 93>
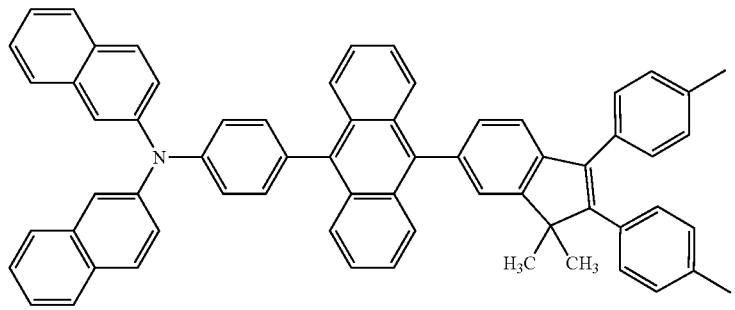
<Formula 94>
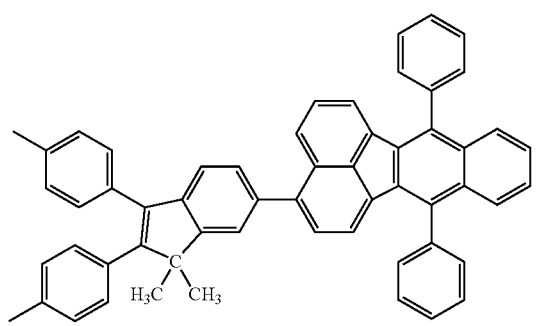
<Formula 95>
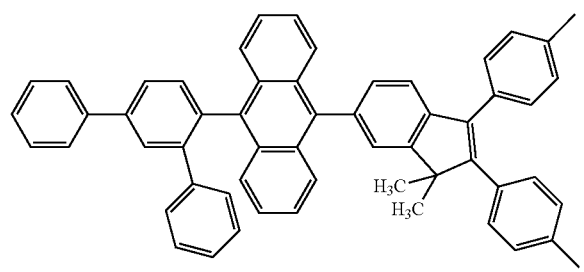
<Formula 96>
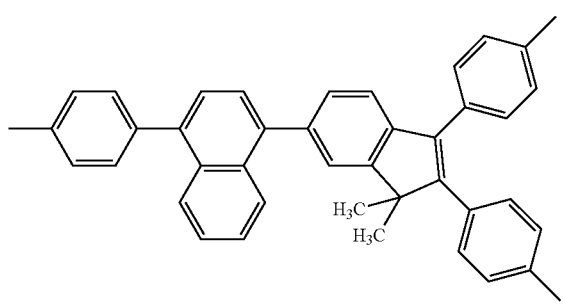
<Formula 97>
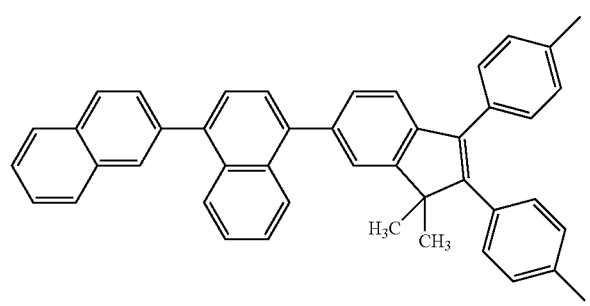
<Formula 98>
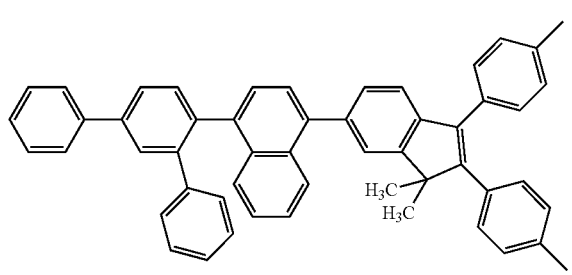
<Formula 99>
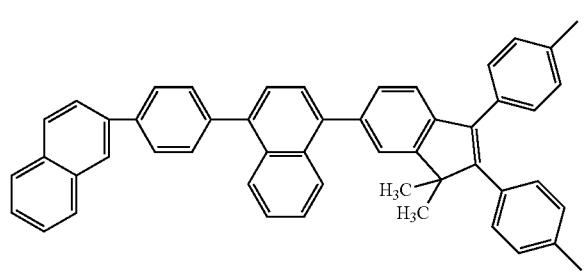
<Formula 100>
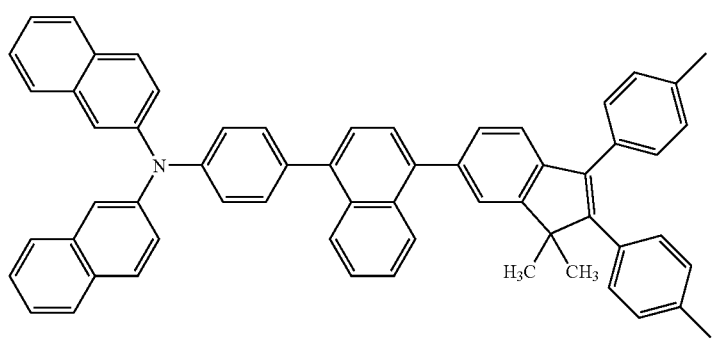

The organic light-emitting compound of Formula 1 according to an embodiment of the present invention can be synthesized using a general synthesis method. Detailed synthetic pathways of the compound will be described in Synthesis Examples below.

The present invention also provides an organic light-emitting device comprising a first electrode, a second electrode, and an organic layer interposed between the first and second electrodes, wherein the organic layer contains the compound of Formula 1 below:

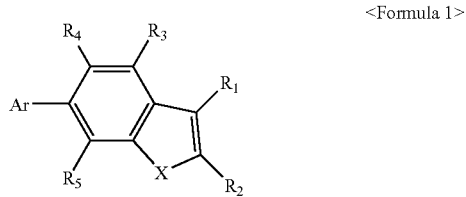

<Formula 1> where Ar is a substituted or unsubstituted $C_6$-$C_{50}$ aryl group;

each of $R_1$, $R_2$, $R_3$, $R_4$, and $R_5$ is independently selected from the group consisting of hydrogen, a halogen atom, a cyano group, a nitro group, a hydroxyl group, a substituted or unsubstituted $C_1$-$C_{50}$ alkyl group, a substituted or unsubstituted $C_1$-$C_{50}$ alkoxy group, a substituted or unsubstituted $C_5$-$C_{50}$ cycloalkyl group, a substituted or unsubstituted $C_5$-$C_{50}$ heterocycloalkyl group, a substituted or unsubstituted $C_6$-$C_{50}$ aryl group, a substituted or unsubstituted $C_2$-$C_{50}$ heteroaryl group, —$N(Z_1)(Z_2)$, and —$Si(Z_3)(Z_4)(Z_5)$, wherein $R_2$ is not an anthracene group;

each of $Z_1$, $Z_2$, $Z_3$, $Z_4$, and $Z_5$ is independently selected from the group consisting of hydrogen, a substituted or unsubstituted $C_1$-$C_{50}$ alkyl group, a substituted or unsubstituted $C_6$-$C_{50}$ aryl group, a substituted or unsubstituted $C_2$-$C_{50}$ heteroaryl group, a substituted or unsubstituted $C_5$-$C_{50}$ cycloalkyl group, and a substituted or unsubstituted $C_5$-$C_{50}$ heterocycloalkyl group;

X is selected from the group consisting of $C(Z_6)(Z_7)$, $N(Z_8)$, O, S, $SO_2$, Se, and $SeO_2$; and each of $Z_6$, $Z_7$, and $Z_8$ is independently hydrogen, a substituted or unsubstituted $C_1$-$C_{20}$ alkyl group, or a substituted or unsubstituted $C_1$-$C_{50}$ aryl group.

The compound of Formula 1 is suitable as a material for an organic layer, and in particular, an emitting layer, a hole injecting layer or a hole transporting layer, in an organic light-emitting device.

Unlike a conventional organic light-emitting device in which the stability of an organic layer deteriorates when the organic layer is formed using a liquid coating method, the organic-light-emitting device according to an embodiment of the present invention contains the organic light-emitting compound of Formula 1 that has high solubility and thermal stability and can form a stable organic layer, and thus has a low turn-on voltage and improved light-emitting characteristics, for example, in color purity.

The organic light-emitting device according to an embodiment of the present invention may have various structures. For example, at least one layer selected from the group consisting of a hole injecting layer, a hole transporting layer, a hole blocking layer, an electron blocking layer, an electron transporting layer, and an electron injecting layer can be further formed between the first and second electrodes.

Figure 1B:
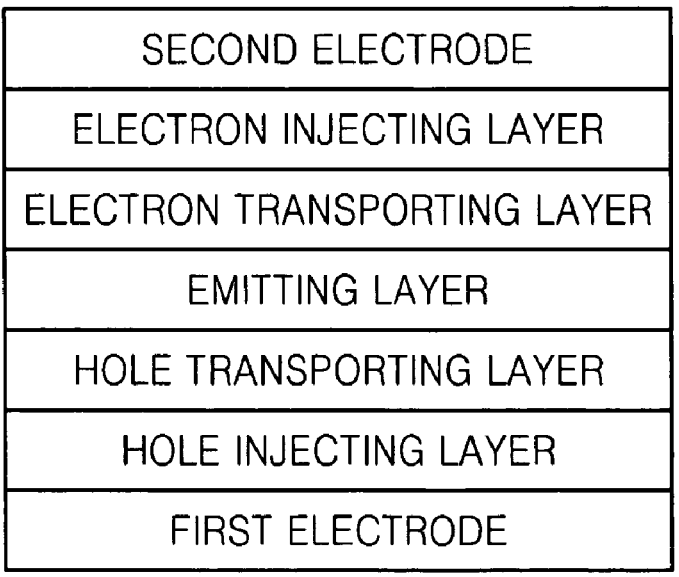
Figure 1C:
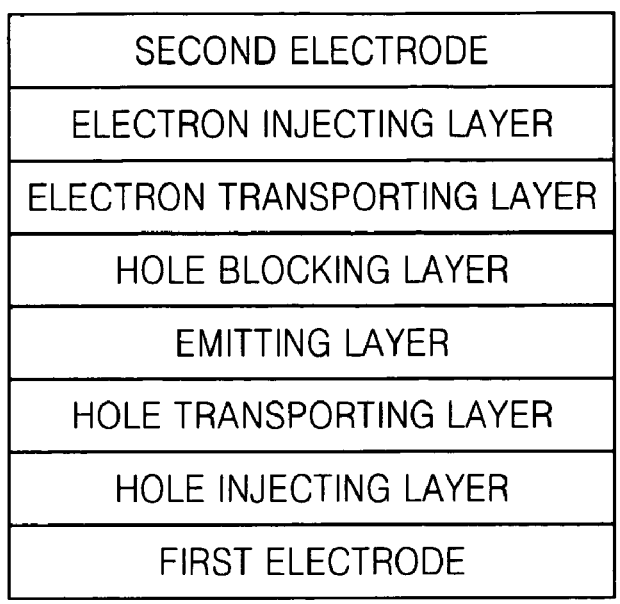

The exemplary structures of organic light-emitting devices according to embodiments of the present invention are shown in FIGS. 1A, 1B, and 1C. The organic light-emitting device of FIG. 1A has a structure including a first electrode, a hole injecting layer, an emitting layer, an electron transporting layer, an electron injecting layer, and a second electrode. The organic light-emitting device of FIG. 1B has a structure including a first electrode, a hole injecting layer, a hole transporting layer, an emitting layer, an electron transporting layer, an electron injecting layer, and a second electrode. The organic light-emitting device of FIG. 1C has a structure including a first electrode, a hole injecting layer, a hole transporting layer, an emitting layer, a hole blocking layer, an electron transporting layer, an electron injecting layer, and a second electrode. Here, at least one of the emitting layer, the hole injecting layer, and the hole transporting layer may contain the organic light-emitting compound of Formula 1 according to an embodiment of the present invention.

The emitting layer of an organic light-emitting device according to an embodiment of the present invention can contain a phosphorescent or fluorescent dopant of red, green, blue, or white. The phosphorescent dopant can be an organic metal compound containing at least one selected from the group consisting of Ir, Pt, Os, Ti, Zr, Hf, Eu, Tb, and Tm.

Hereinafter, a method of manufacturing an organic light-emitting device according to an embodiment of the present invention will be described with reference to the organic light-emitting device shown in FIG. 1C.

Initially, a first electrode is formed on a substrate using a first electrode material by deposition, sputtering, or etc. The first electrode can be an anode. Any substrate commonly used in organic light-emitting devices can be used. For example, a glass substrate which is mechanically strong, thermally stable, transparent, easy to handle, and highly waterproof, and has excellent surface flatness, or a transparent plastic substrate can be used. Examples of the first electrode material include indium tin oxide (ITO), indium zinc oxide (IZO), tin oxide ($SnO_2$), zinc oxide (ZnO), etc., which are transparent and have excellent conductivity.

Next, a hole injecting layer (HIL) is formed on the first electrode using various methods, for example, vacuum deposition, spin coating, inkjet printing, nozzle printing, spray printing, organic vapor jet printing, organic vapor phase deposition, casting, LB, etc.

When forming the hole injecting layer (HIL) using vacuum deposition, the deposition conditions can vary according to the compound used as a material for the hole injecting layer, the structure or thermal characteristics of the hole injecting layer, etc. In general, the deposition temperature can be in the range of 100-500° C., the degree of vacuum can be in the range of $10^{-8}$ or $10^{-3}$ torr, and the deposition rate can be in the range of 0.01-100 Å/sec. The thickness of the HIL may be in the range of 10 Å-5 μm.

When forming the hole injecting layer (HIL) using spin coating, the coating conditions can vary according to the compound used as a material for the hole injecting layer, the structure or thermal characteristics of the hole injecting layer, etc. In general, the coating rate can be in the range of 2000-5000 rpm, and the temperature of a thermal treatment performed to remove solvent after the coating can be in the range of 80-200° C.

The hole injecting layer can be formed using the compound of Formula 1 described above. Alternatively, examples of a material for the hole injecting layer include phthalocyanine compounds, such as copper phthalocyanine, etc., disclosed in U.S. Pat. No. 4,356,429, star-burst type amine derivatives disclosed in Advanced Material 6, p. 677 (1994), such as 4,4',4"-tri(N-carbazolyl)triphenylamine (TCTA), 4,4',4"-tris (3-methylphenylphenlyamino)triphenylamine (m-MT-DATA), and 1,3,5-tris[4-(3-methylphenylphenylamino)phenyl]benzene (m-MTDAPB), soluble conductive polymers, such as Pani/DBSA (Polyaniline/Dodecylbenzenesulfonic acid), PEDOT/PSS (Poly(3,4-ethylenedioxythiophene)/Poly (4-styrenesulfonate)), Pani/CSA (Polyaniline/Camphor sulfonic acid), PANI/PSS ((Polyaniline)/Poly (4-styrene-sulfonate)), etc. but are not limited thereto.

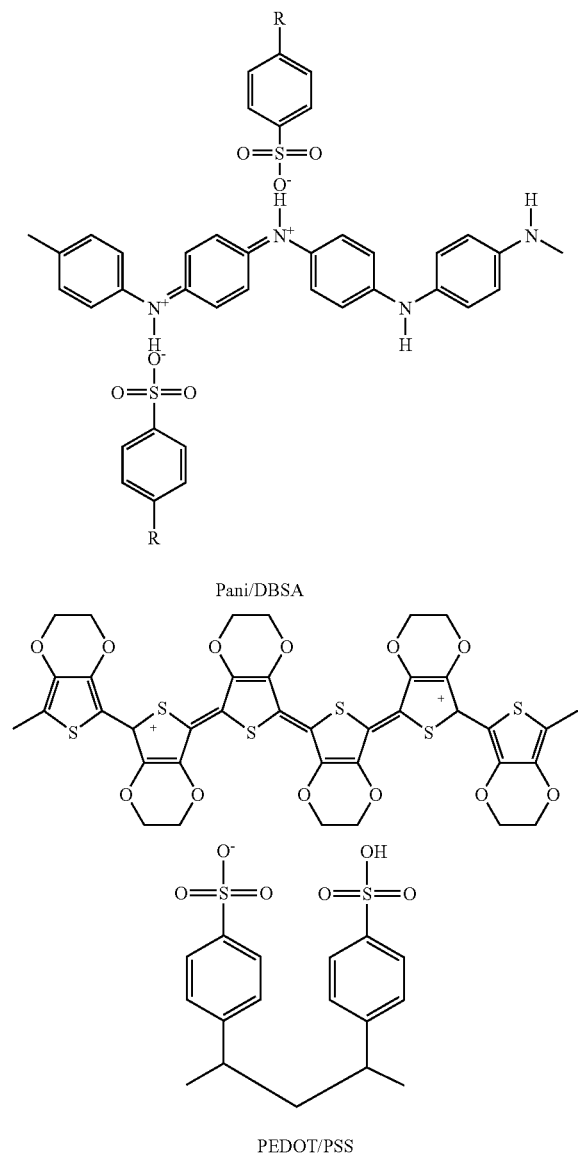

Pani/DBSA

PEDOT/PSS

The thickness of the hole injecting layer can be about 100-10000 Å, for example, 100-1000 Å. When the thickness of the hole injecting layer is less than 100 Å, hole injection characteristics may deteriorate. When the thickness of the hole injecting layer exceeds 10000 Å, the turn-on voltage increases.

Next, a hole transporting layer (HTL) can be formed on the hole injecting layer using various methods, such as vacuum deposition, spin coating, casting, LB, etc. When the hole transporting layer (HTL) is formed using vacuum deposition or spin coating, the deposition conditions and the coating conditions can vary according to the compound used as a material for the hole transporting layer (HTL). However, in general, the deposition conditions and the coating conditions are determined to be the same ranges as applied to form the hole injecting layer (HIL).

The hole transporting layer (HLT) can be formed using the compound of Formula 1 according to an embodiment of the present invention described above. Alternatively, examples of a material for the hole transporting layer (HLT) include common hole transporting materials, for examples, carbazole derivatives, such as N-phenyl carbazole, polyvinylcarbazole, etc., common amine derivatives having an aromatic fused ring, such as N,N'-bis(3-methyl phenyl)-N,N'-diphenyl-[1,1-biphenyl]-4,4'-diamine (TPD), N,N'-di(naphthalene-1-yl)-N,N'-diphenyl benzidine (a-NPD), etc., but are not limited thereto.

The thickness of the hole transporting layer may be in the range of about 50-1000 Å, for example, 100-600 Å. When the thickness of the hole transporting layer is less than 50 Å, the hole transportation characteristics deteriorate. When the thickness of the hole transporting layer exceeds 1000 Å, the turn-on voltage increases.

Next, the emitting layer (EML) is formed on the hole transporting layer (HTL) using vacuum deposition, spin coating, casting, LB, etc. When the emitting layer (EML) is formed using vacuum deposition or spin coating, the deposition conditions and the coating conditions can vary according to the compound used as a material for the emitting layer (EML). However, in general, the deposition conditions and the coating conditions are determined to be the same ranges as applied to form the hole injecting layer (HIL).

The emitting layer (EML) may contain the compound of Formula 1 according to an embodiment of the present invention described above. The compound of Formula 1 can be used alone or in combinations with a common suitable host material or a common dopant material. Examples of the host material include Alq3 (aluminum(III)tris(8-hydroxyquinolate)), CBP (4,4'-N,N'-dicarbazolyl-biphenyl), PVK (poly(n-vinylcarbazole)), etc., but are not limited thereto. Examples of fluorescent dopants include IDE102, IDE105, which are available from Idemitsu Co., C545T, which is available from Hayashibara Co., etc. Examples of phosphorescent dopants include PtOEP, RD 61 of UDC Co., which are red phosphorescent dopants, Ir(PPy)3(PPy=2-phenylpyridine), which is a green phosphorescent dopant, F2Irpic, which is a green phosphorescent dopant, etc., but are not limited thereto.

<Formula 101>

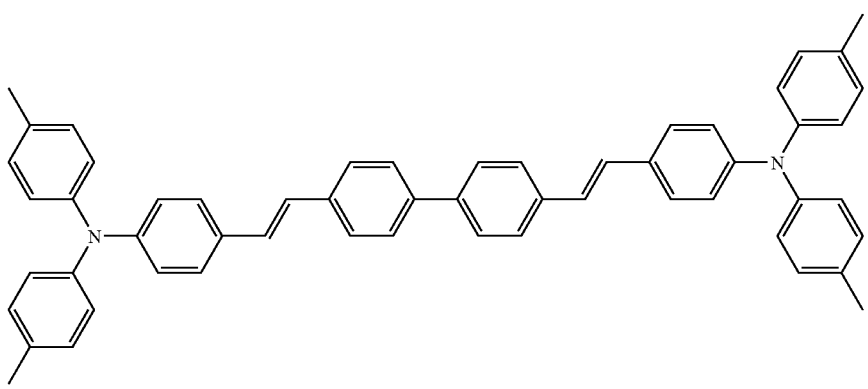

The amount of dopants is not specifically limited, but can be in the range of 0.01-15 parts by weight based on 100 parts by weight of the host.

The thickness of the emitting layer can be in the range of about 100-2000 Å, for example, 200-1000 Å. When the thickness of the emitting layer is smaller than 100 Å, the emitting characteristics may degrade. When the thickness of the emitting layer exceeds 2000 Å, the turn-on voltage increases.

When a phosphorescent dopant is additionally used in the emitting layer (EML), to prevent diffusion of triplet excitons or holes into the electron transporting layer (ETL), a hole blocking layer (HBL) can be formed on the emitting layer (EML) using vacuum deposition, spin coating, casting, LB, etc. When forming the hole blocking layer (HBL) using vacuum deposition or spin coating, the deposition conditions and the coating conditions can vary according to the compound used as a material for the hole blocking layer (HBL). However, in general, the deposition conditions and the coating conditions are determined to be the same ranges as applied to form the hole injecting layer (HIL). Examples of a material for the hole blocking layer (HBL) that can be used include, for example, oxadiazole derivatives, triazole derivatives, phenanthroline derivatives, BCP, etc.

The thickness of the hole blocking layer (HBL) can be in the range of about 50-1000 Å, for example, 100-300 Å. When the thickness of the hole blocking layer (HBL) is smaller than 50 Å, the hole blocking characteristics may deteriorate. When the thickness of the hole blocking layer (HBL) exceeds 1000 Å, the turn-on voltage increases.

Next, an electron transporting layer (ETL) is formed using various methods, for example, vacuum deposition, spin coating, casting, etc. When the electron transporting layer (ETL) is formed using vacuum deposition or spin coating, the deposition conditions and the coating conditions can vary according to the compound used as a material for the electron transporting layer (ETL). However, in general, the deposition conditions and the coating conditions are determined to be the same ranges as applied to form the hole injecting layer (HIL). Any common material that can stably transport electrons injected from an electron injecting electrode (cathode), for example, tris (8-quinolinolate)aluminium (Alq3), 3-phenyl-4-(1'-naphthyl)-5-phenyl-1,2,4-triazole (TAZ), aluminum (III)bis(2-methyl-8-quinolinato)$_4$-phenylphenolate (Balq), etc., can be used for the electron transporting layer (ETL).

The thickness of the electron transporting layer (ETL) can be in the range of about 100-1000 Å, for example, 200-500 Å. When the thickness of the electron transporting layer (ETL) is smaller than 100 Å, the electron transport characteristics may deteriorate. When the thickness of the electron transporting layer (ELT) exceeds 1000 Å, the turn-on voltage increases.

In addition, an electron injecting layer (EIL), which allows electrons to be easily injected from the cathode, may be formed on the electron transporting layer (ETL). Any materials which are known as materials for the electron injecting layer (EIL), for example, LiF, NaCl, CsF, $Li_2O$, BaO, etc., can be used. The electron injecting layer (EIL) can be formed, for example, vacuum deposition. The deposition conditions can vary according to the compound used as a material for the electron injecting layer (EIL). Preferably, the deposition conditions are determined to be the same range as applied to form the hole injecting layer (HIL).

The thickness of the electron injecting layer (EIL) can be in the range of about 1-100 Å, for example, 5-50 Å. When the thickness of the electron injecting layer (EIL) is less than 1 Å, the electron injection characteristics may deteriorate. When the thickness of the electron injecting layer (EIL) exceeds 100 Å, the turn-on voltage increases.

Finally, a second electrode is formed on the electron injecting layer (EIL) using vacuum deposition, sputtering, etc. The second electrode can be used as a cathode. Examples of a material for the second electrode include a metal having a low work function, an alloy thereof, an electrically conductive compound, a combination thereof, etc. Examples of the material for the second electrode include lithium (Li), magnesium (Mg), aluminium (Al), aluminium-lithium (Al—Li), calcium (Ca), magnesium-indium (Mg—In), magnesium-silver (Mg—Ag), etc., but are not limited thereto. In a front-emission light-emitting device, a transmissive cathode formed using ITO, IZO, etc., can be used.

Hereinafter, the present invention will be described in greater detail with reference to the following examples. The following examples are for illustrative purpose only and are not intended to limit the scope of the invention.

EXAMPLES

Synthesis Example 1

Compound 4 represented by Formula 4 was synthesized according to the reaction pathways in Reaction Scheme 1, 2, and 3 below.

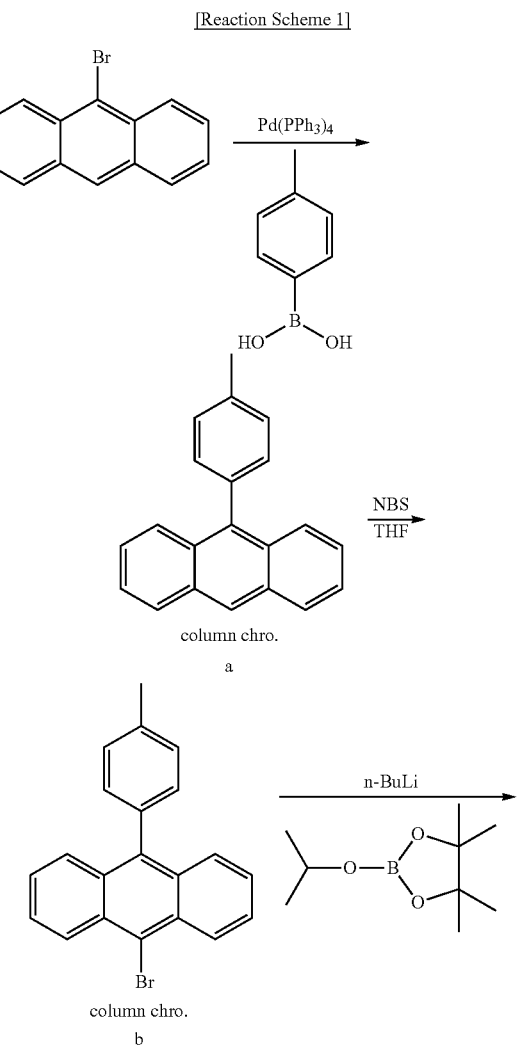

39

-continued

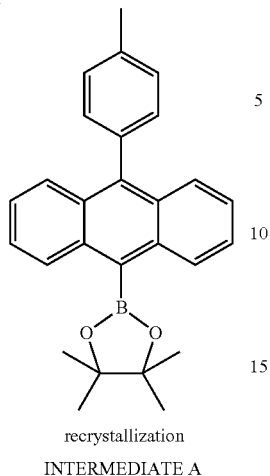

recrystallization
INTERMEDIATE A

Synthesis of Intermediate A (a) Synthesis of 9-p-tolyl-anthracene 5 g (1 eq, 15.6 mmol) of 9-bromo anthracene, 3.61 g of p-tolylboronic acid (1.7 eq, 26.5 mmol), 2.15 g (1.3 eq, 20.3 mmol) of $Na_2CO_3$, and 0.54 g (0.03 eq, 0.47 mmol) of tetrakis (triphenylphosphine)palladium were put into a 500-ml round-bottomed flask in Ar gas condition. 5 ml of THF and 2.2 ml of water, based on 1 mmol of p-tolylboronic acid, were added into the flask and refluxed at 85° C. for 16 hours. After the color of the solution changed to dark brown, water was added to the solution, and the organic phase was extracted using ethyl acetate. The extracted organic phase was dried using anhydrous magnesium sulfate and filtered to remove the solvent. The dried organic phase was dissolved in a small amount of toluene and separated using column chromatography (silica and hexane). A resulting solid was recrystallized using toluene and methanol to obtain 4.5 g (86%) of a white solid.

(b) Synthesis of 9-bromo-10-p-tolyl-anthracene 4 g (1 eq, 14.9 mmol) of 9-p-tolyl-anthracene, 5.3 g (2 eq, 29.8 mmol) of NBS were dissolved in 200 ml of THF in a 500-ml round-bottomed flask and stirred for 1 hour. 200 ml of water was added to the solution to obtain yellow crystals. The yellow crystals were filtered, dissolved in a small amount of toluene, and separated using column chromatography (silica and hexane) to obtain 4.6 g (89%) of yellow crystals.

Synthesis of 4,4,5,5-tetramethyl-2-(10-p-tolyl-anthracene-9-yl)-[1,3,2]-dioxaborolane (Intermediate A)

4.6 g (1 eq, 13.25 mmol) of 9-bromo-10-p-tolyl-anthracene was dissolved in 150 ml of THF in a 500 ml round-bottomed flask in Ar gas condition, and 6.36 ml (1.2 eq, 15.9 mmol) of 2.5M n-BuLi (in hexane) was added to the solution at −78° C. After stirring the solution at −78° C. for 1 hour, 3.52 ml (1.3 eq, 17.23 mmol) of 2-isopropoxy-4,4,5,5-tetramethyl-1,3,2-dioxaborolane was added to the solution and stirred at room temperature for 2 hours. Next, 50 ml of water was added to the solution to terminate the reaction, and the organic phase of the solution was extracted using brine and

40 methylene chloride. The extracted organic phase was dried using anhydrous magnesium sulfate and filtered to remove the solvent. The dried organic phase was dissolved in a small amount of toluene and subjected to column chromatography (silica and hexane) to remove impurities. Next, the polarity of the eluent solvent was increased to obtain 3.5 g (67%) of a white solid.

Synthesis of Intermediate B

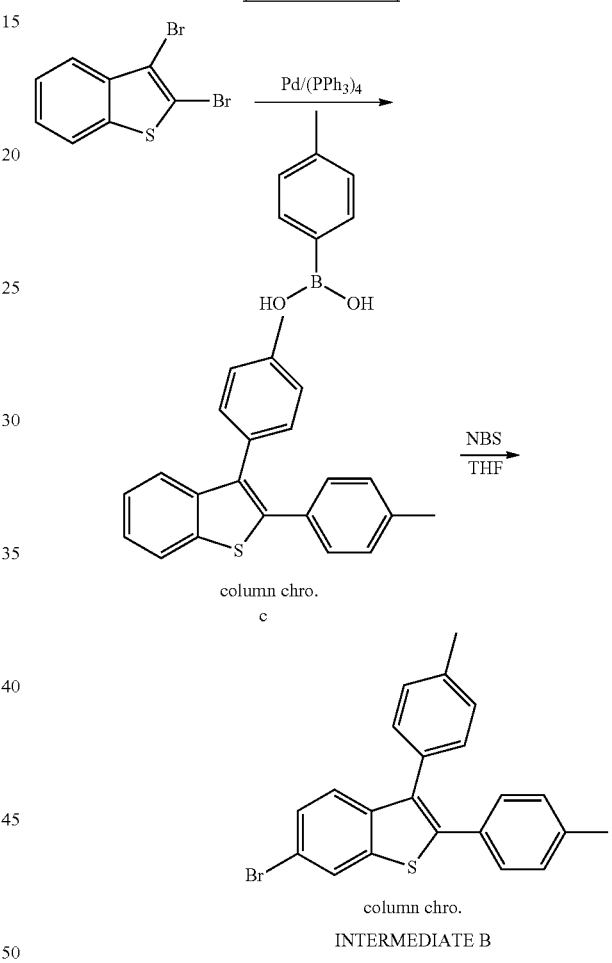

(c) Synthesis of 2,3-di-p-tolyl-benzo[b]thiophene 4.5 g (1 eq, 10.27 mmol) of 2,3-dibromo-benzo[b] thiophene, 4.89 g (3.5 eq, 35.95 mmol) of p-tolylboronic acid, 2.39 g (2.2 eq, 22.59 mmol) of $Na_2CO_3$, 0.36 g (0.03 eq, 0.31 mmol) of tetrakis(triphenylphosphine)palladium were put into a 500-ml round-bottomed flask in Ar gas condition. 5 ml of THF and 2.2 ml of water, based on 1 mmol of p-tolylboronic acid, were added into the flask and refluxed at 85° C. for 7 hours. After the color of the solution changed to dark brown, water was added to the solution, and the organic phase was extracted using ethyl acetate. The extracted organic phase was dried using anhydrous magnesium sulfate and filtered to remove the solvent. The dried organic phase was dissolved in a small amount of toluene and separated using column chromatography (silica and hexane) to obtain 2.8 g (87%) of a white solid.

Synthesis of 6-bromo-2,3-di-p-tolyl-benzo[b]thiophene (Intermediate B)

2.5 g (1 eq, 7.9 mmol) of 2,3-di-p-tolyl-benzo[b]thiophene and 14 g (10 eq, 79 mmol) of NBS were dissolved in 200 ml of THF in a 500 ml-round-bottomed flask and stirred for 6 hours. 50 ml of water was added to the solution to terminate the reaction, and the organic phase was extracted using brine and methylene chloride. The extracted organic phase was dried using anhydrous magnesium sulfate and filtered to remove the solvent. A resulting solid was recrystallized using methylene chloride and hexane, dissolved in a small amount of THF, and separated using column chromatography (silica and hexane) to obtain 2.5 g (71%) of a yellow solid.

[Reaction Scheme 3]

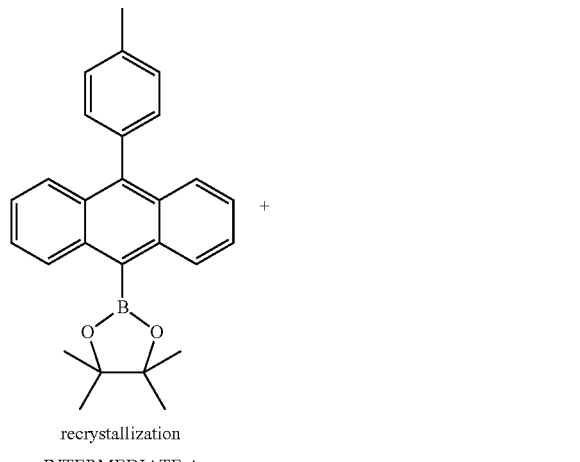

toluene and 4 ml of water was added to the solution and stirred at a reflux temperature for 24 hours. After cooling the reaction solution to room temperature, 100 ml of diethylether was added to the reaction solution and washed twice with 100 ml of water to obtain the organic phase. The organic phase was dried using anhydrous magnesium sulfate, and the remaining solvent was evaporated to obtain a crude product. The crude product was purified through separation using silica gel column chromatography and recrystallized to obtain 400 mg (63%) of Compound 4.

$^1$H-NMR (CDCl$_3$, 300 MHz, ppm): 7.98-7.08 (m, 15H), 2.57 (s, 3H), 2.45 (s, 3H), 2.36 (s, 3H)

Synthesis Example 2

Compound 55 represented by Formula 55 was synthesized in the same manner as in Synthesis Example 1, except that 6-bromo-2-phenyl-3-p-tolyl-methylindole was used instead of 2,3-dibromo-benzo[b]thiophene used to synthesize Intermediate B in Synthesis Example 1.

Synthesis Example 3

Compound 7 represented by Formula 7 was synthesized according to the reaction pathway in Reaction Scheme 4 below.

[Reaction Scheme 4]

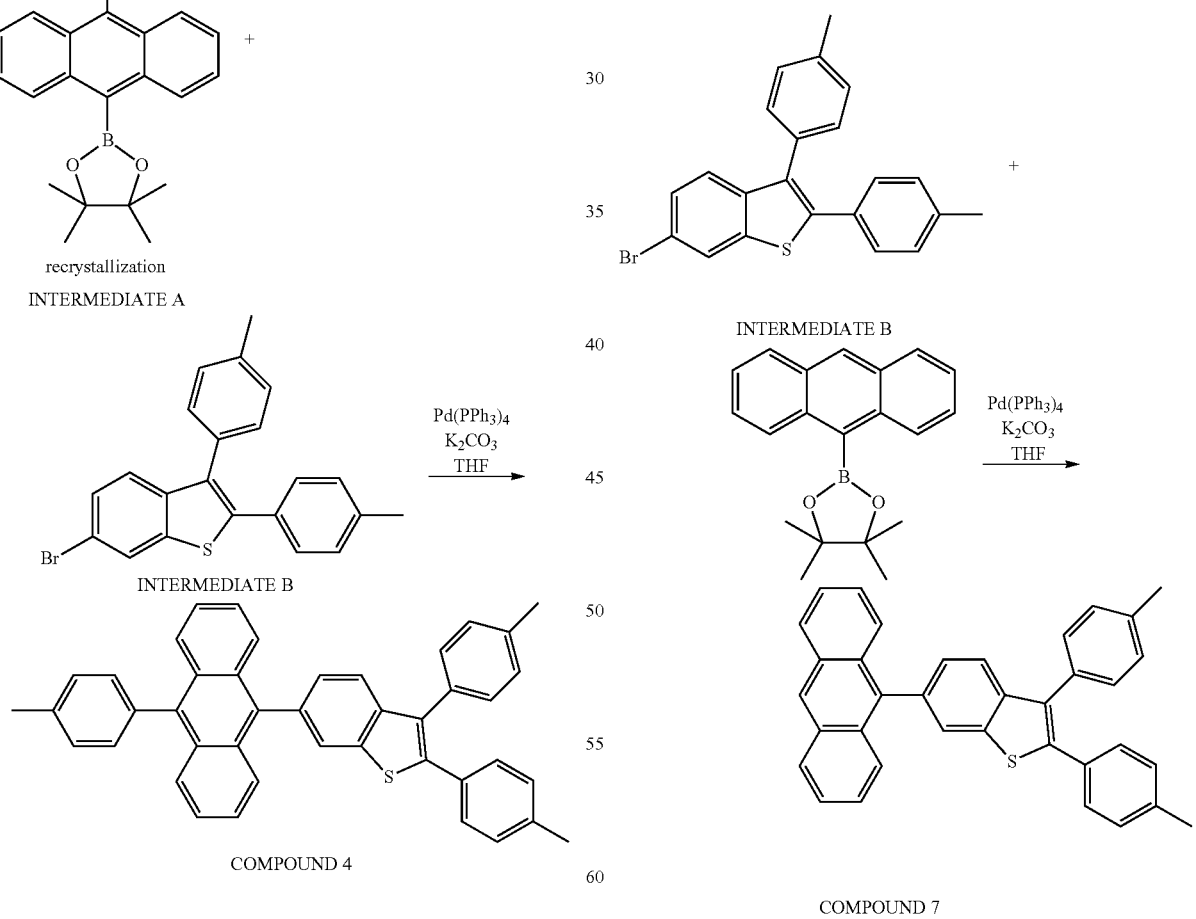

Synthesis of Compound 4

After dissolving 787 mg (2.2 mmol) of Intermediate B in 70 ml of THF, a solution of 867.5 mg (2.2 mmol) of Intermediate A, 231 mg (0.2 mmol) of tetrakis(triphenylphosphine)palladium, and 8 mmol of K$_2$CO$_3$ dissolved in 30 ml of After dissolving 787 mg (2.2 mmol) of Intermediate B in 70 ml of THF, a solution of 609 mg (2.2 mmol) of 2-anthracene-9-yl-4,4,5,5-tetramethyl-1,3,2-dioxaborolane, 231 mg (0.2 mmol) of tetrakis(triphenylphosphine)palladium, and 8 mmol of K$_2$CO$_3$ dissolved in 30 ml of toluene and 4 ml of water was added to the solution and stirred at a reflux temperature for 24 hours. After cooling the reaction solution to room temperature, 100 ml of diethylether was added to the reaction solution and washed twice with 100 ml of water to obtain the organic phase. The organic phase was dried using anhydrous magnesium sulfate, and the remaining solvent was evaporated to obtain a crude product. The crude product was purified through separation using silica gel column chromatography and recrystallized to obtain 400 mg (81.5%) of Compound 7.

$^1$H-NMR (CDCl$_3$, 300 MHz, ppm): 8.52-7.09 (m, 12H), 1.52 (s, 3H), 1.53 (s, 3H)

Synthesis Example 4

Compound 5 represented by Formula 5 was synthesized according to the reaction pathway in Reaction Scheme 5 below.

[Reaction Scheme 5]

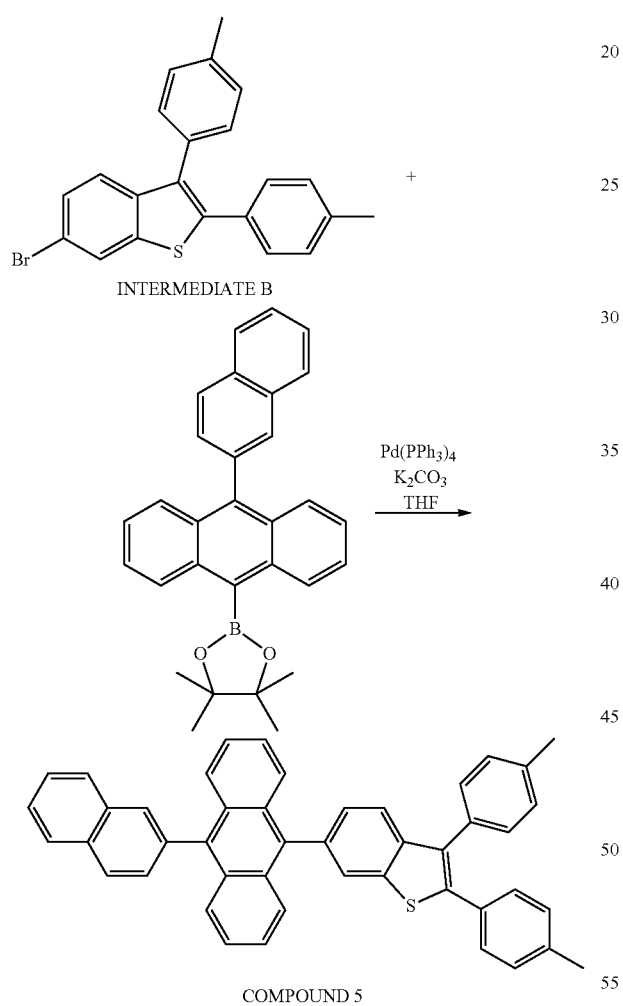

COMPOUND 5

Compound 8 was synthesized in the same manner as in Synthesis Example 1, except that 9-naphthyl-anthracene was used instead of 9-p-tolyl-anthracene used to synthesize Intermediate A in Synthesis Example 1.

$^1$H-NMR (CDCl$_3$, 300 MHz, ppm): 8.02-7.15 (m, 18H), 2.47 (s, 3H), 2.38 (s, 3H)

Synthesis Example 5

Compound 17 represented by Formula 17 was synthesized according to the reaction pathways in Reaction Schemes 6, 7, and 8 below.

[Reaction Scheme 6]

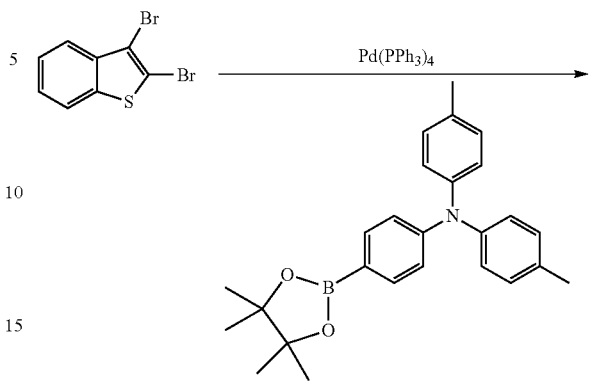

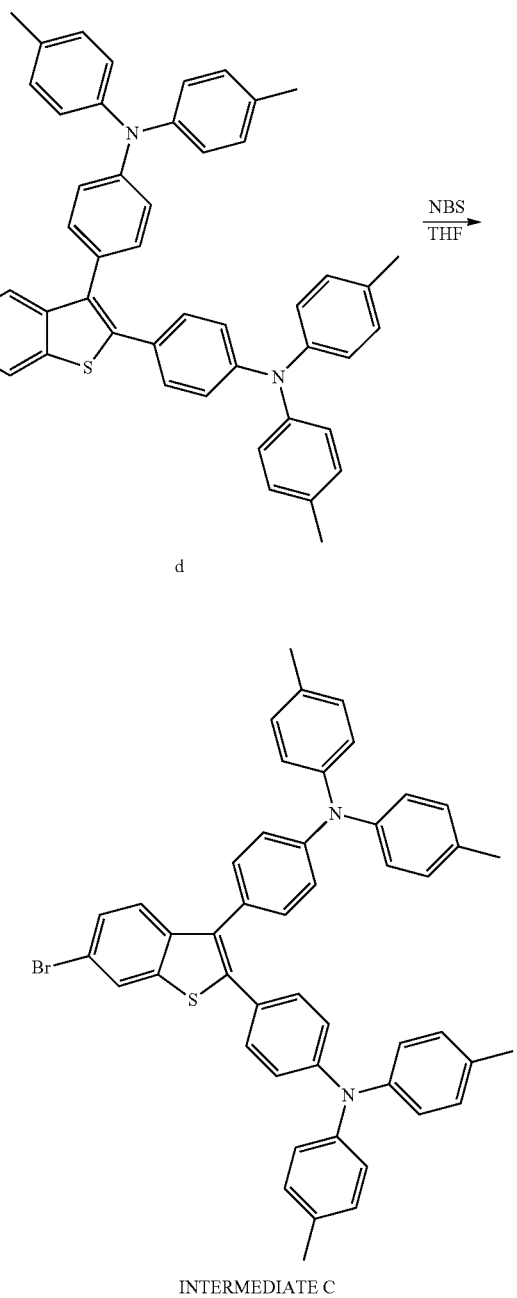

INTERMEDIATE C

Synthesis of Intermediate C

(d) Synthesis of 2,3-di-p-tolylaminophenyl-benzo[b]thiophene 2,3-di-p-tolylaminophenyl-benzo[b]thiophene was synthesized in the same manner as in Synthesis Example 1, except that [4-(4,4,5,5-tetramethyl-1,3,2-dioxaborolane-2-yl)-phenyl]-di-p-tolylamine was used instead of p-tolylboronic acid used to synthesize Intermediate B in Synthesis Example 1.

Synthesis of 6-bromo-2,3-di-p-tolylaminophenyl-benzo[b]thiophene (Intermediate C)

Intermediate C was synthesized in the same manner as in Synthesis Example 1, except that 2,3-di-p-tolylaminophenyl-benzo[b]thiophene was used instead of 2,3-di-p-tolyl-benzo[b]thiophene used to synthesize Intermediate B in Synthesis Example 1.

Synthesis of Intermediate D

[Reaction Scheme 7]

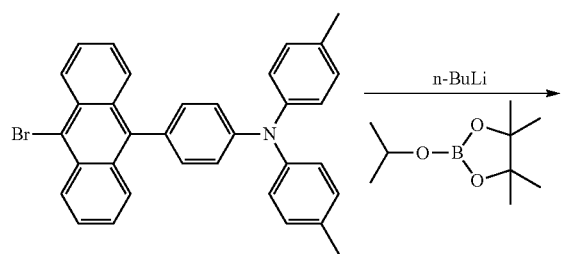

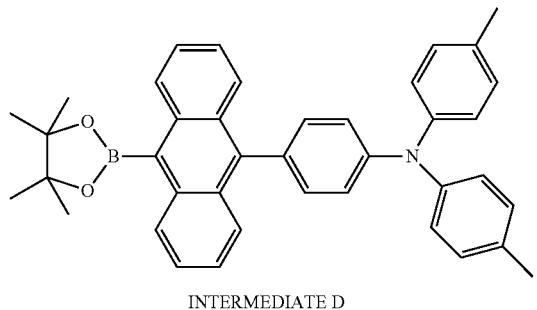

INTERMEDIATE D

Intermediate D was synthesized in the same manner as in Synthesis Example 1, except that [4-(10-bromo-anthracene-9-yl-phenyl]-di-p-tolylamine was used instead of 9-bromo-10-p-tolyl-anthracene used to synthesize Intermediate A in Synthesis Example 1.

Synthesis of Compound 17

[Reaction Scheme 8]

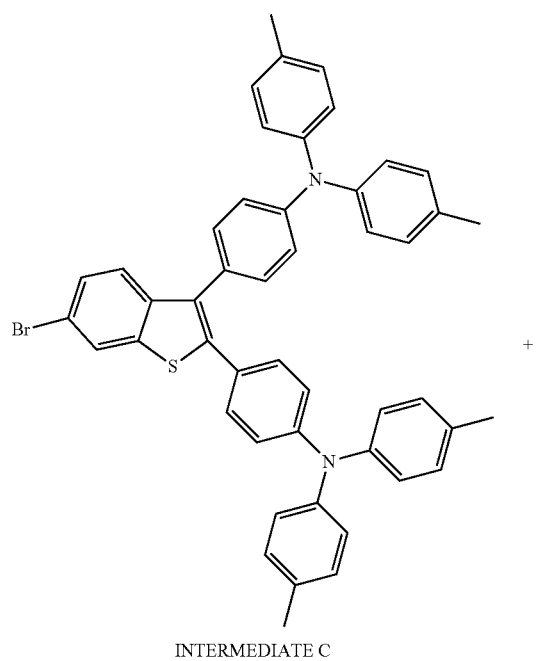

INTERMEDIATE C

-continued

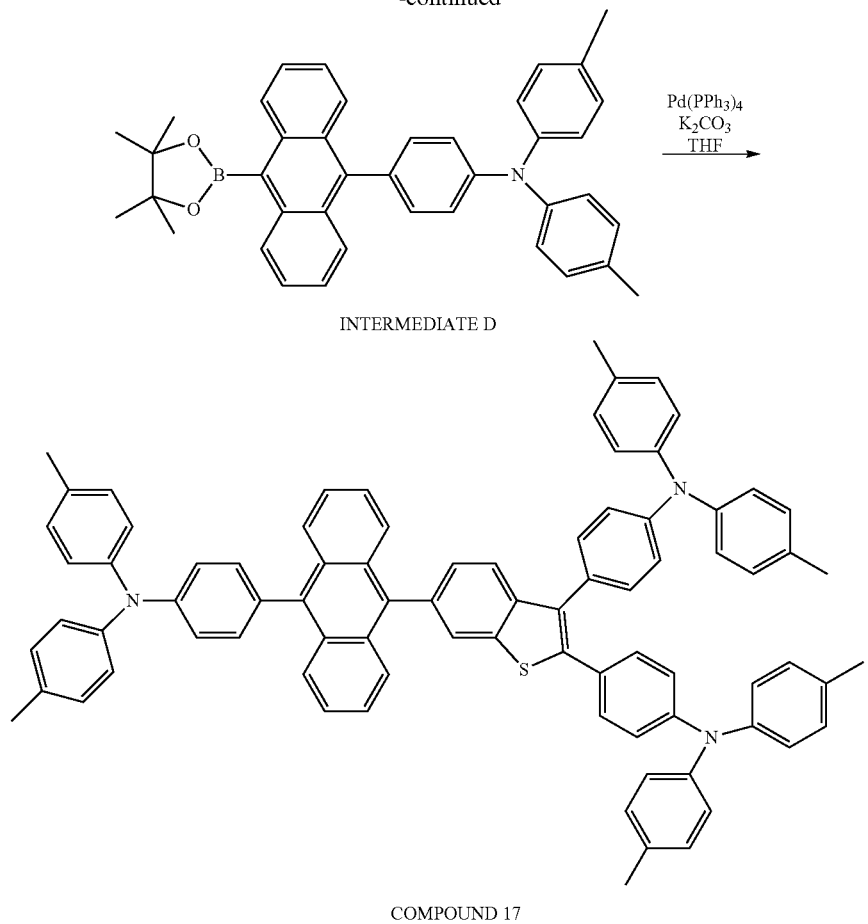

INTERMEDIATE D

COMPOUND 17

After dissolving 1.6 g (2.2 mmol) of Intermediate C in 100 ml of THF, a solution of 1.2 g (2.2 mmol) of Intermediate D, 231 mg (0.2 mmol) of tetrakis(triphenylphosphine)palladium, and 8 mmol of $K_2CO_3$ dissolved in 55 ml of toluene and 4 ml of water was added to the solution and stirred at a reflux temperature for 24 hours. After cooling the reaction solution to room temperature, 100 ml of diethylether was added to the reaction solution and washed twice with 150 ml of water to obtain the organic phase. The organic phase was dried using anhydrous magnesium sulfate, and the remaining solvent was evaporated to obtain a crude product. The crude product was purified through separation using silica gel column chromatography and recrystallized to obtain 843 mg (68%) of Compound 9.

Evaluation Example 1

Thermal Stability Evaluation

The thermal stabilities of the compounds were evaluated by measuring the glass transition temperature (Tg) and the melting point (Tm) of each of the compounds. Tg and Tm were measured through a thermo gravimetric analysis (TGA) and differential scanning calorimetry (DSC). The results are shown in Table 1.

TABLE 1

| Compound No. | Tg (° C.) | Tm (° C.) |
|---|---|---|
| 4 | 247 | 144 |
| 5 | 273 | 151 |
| 7 | 212 | 116 |
| 17 | 312 | 146 |
| 55 | 295 | 149 |

Table 1 shows that the compounds according to the embodiments of the present invention have thermal stabilities suitable to be used in organic light-emitting devices.

Evaluation Example 2

Evaluation of Light-Emitting Characteristics of Compounds

The light-emitting characteristics of the compounds were evaluated by measuring the UV absorption spectrum and the photoluminescence (PL) spectrum of each of the compounds. Initially, Compound 4 was diluted with toluene to 0.2 mM and used to measure a UV absorption spectrum using a Shimadzu UV-350 Spectrometer. In addition, Compound 4 was diluted with toluene to 10 mM and used to measure to a PL spectrum an ISC PC1 spectrofluorometer with a Xenon lamp. The UV absorption spectrum and PL spectrum measurements were performed on Compounds 4 through 17. The results are shown in Table 2 below.

TABLE 2

| Compound No. | Maximum Absorption Wavelength(nm) | Maximum PL Wavelength (nm) |
|---|---|---|
| 4 | 378 | 432 |
| 5 | 375 | 430 |
| 7 | 368 | 420 |
| 17 | 378 | 440 |
| 55 | 388 | 457 |

Table 2 shows that the compounds according to the embodiments of the present invention have light-emitting characteristics suitable to be used in organic light-emitting devices.

Evaluation Example 3

Evaluation of Light-Emitting Characteristics of Compounds in Film Form

A film was formed using each of the compounds and used to measure the absorption spectrum and quantum efficiency of the film.

Figure 2A:
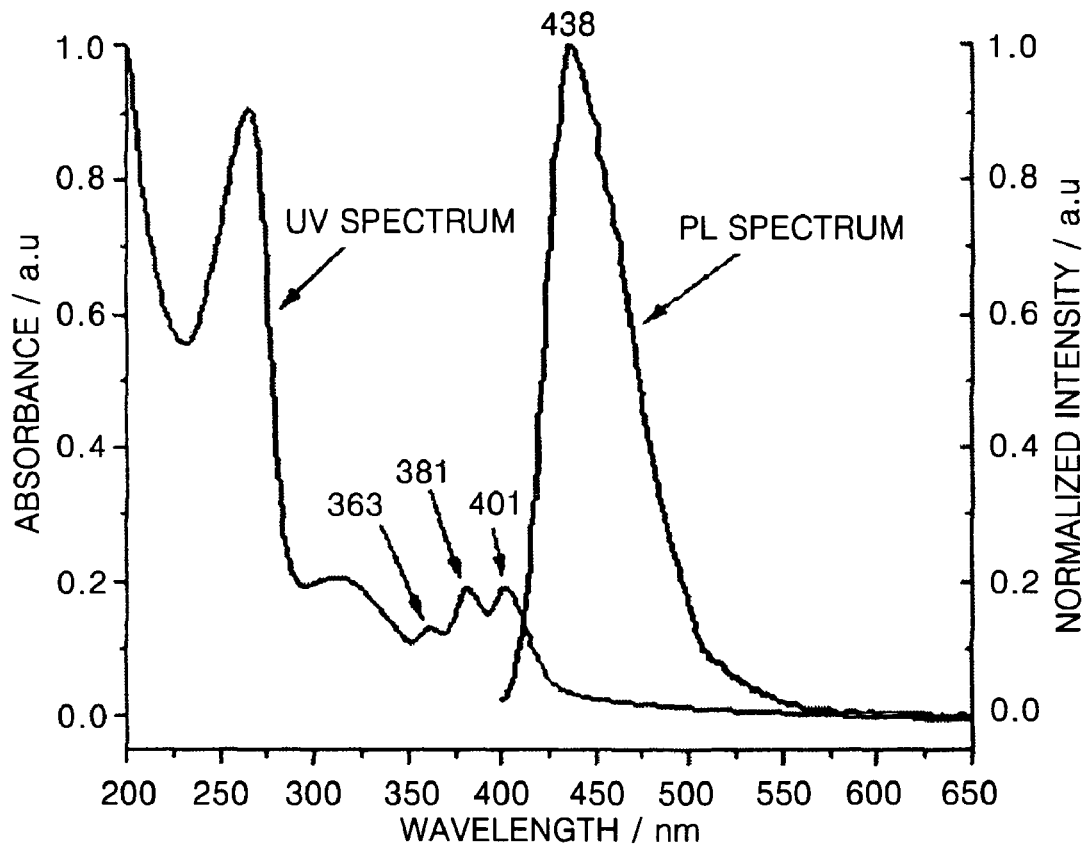
FIGS. 2A through 2C are the UV absorption and photoluminescence (PL) spectra of compounds in film form according to embodiments of the present invention.
Figure 2B:
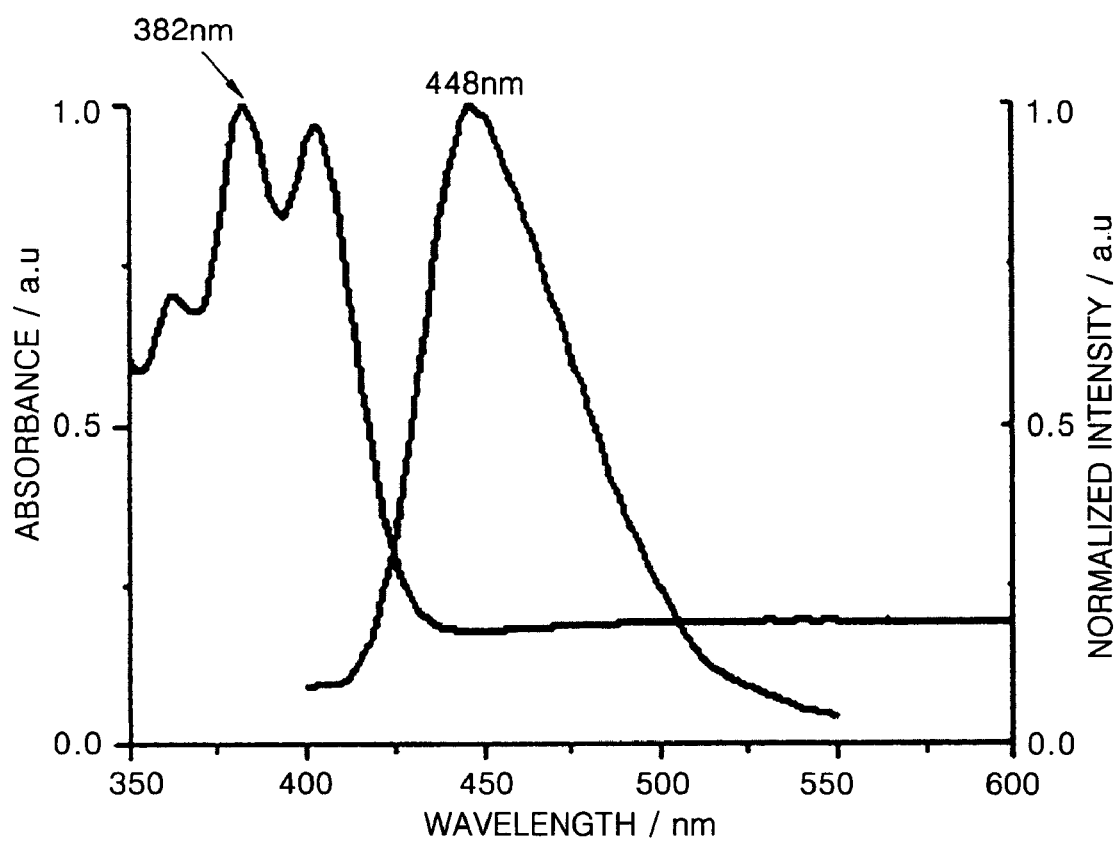
Figure 2C:
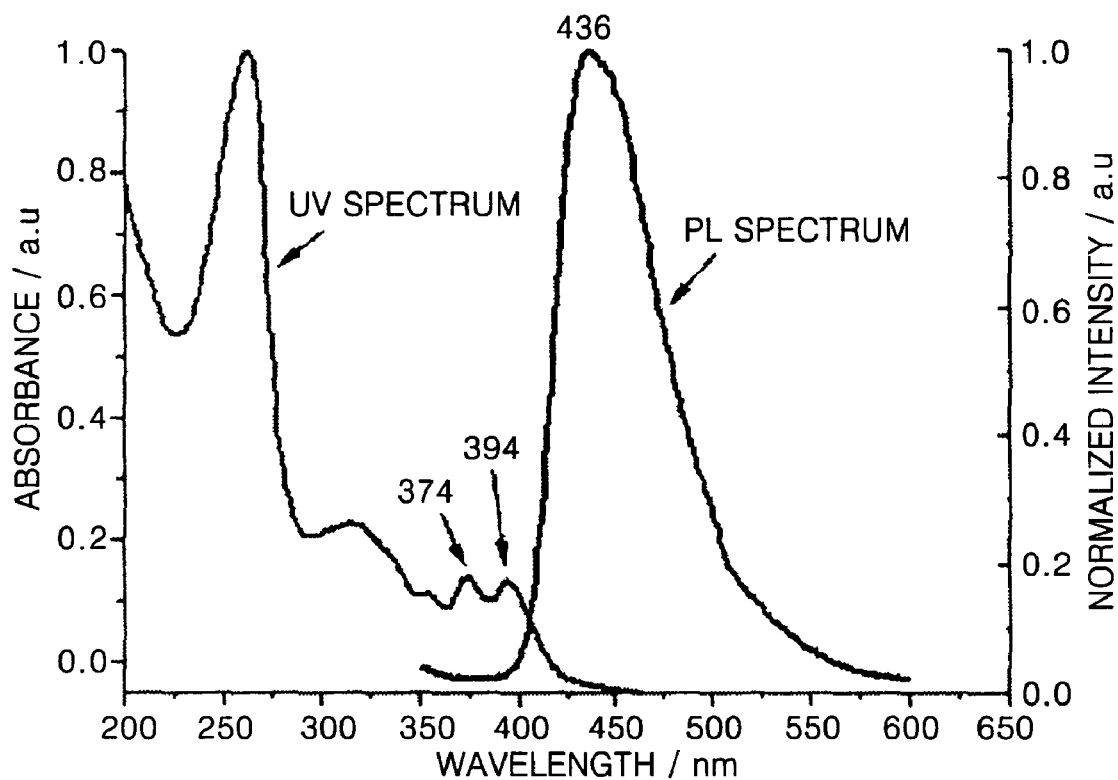

Initially, a quartz substrate was prepared and washed with acetone and pure water. One of the compounds was spin-coated on the quartz substrate and thermally treated at 110° C. for 30 minutes to obtain a film having a thickness of 1000 Å. The absorption spectrum and the quantum efficiency of the film were measured. The same processes were performed using the other compounds. The results are shown in Table 3 below. The absorption spectra of films formed using Compounds 4, 5, and 7 are shown in FIGS. 2A, 2B, and 2C.

TABLE 3

| Film No. | Maximum Absorption Wavelength (nm) | Maximum PL Wavelength (nm) | Quantum Efficiency(%) |
|---|---|---|---|
| Film 4 | 381 | 438 | 12 |
| Film 5 | 382 | 448 | 24 |
| Film 7 | 374 | 436 | 19 |
| Film 17 | 402 | 466 | 26 |
| Film 55 | 379 | 435 | 27 |

Table 3 shows that the absorption spectra and quantum efficiencies of the films formed using the compounds according to the embodiments of the present invention are suitable for organic light-emitting devices.

Example 1

An organic light-emitting device including an emitting layer manufactured using the compound (DPAVBi) of Formula 101 as a dopant and Compound 4 as a host was manufactured. The organic light-emitting device had a structure of ITO/PEDOT (500 Å)/Compound 4+Dopant DPAVBi (480 Å)/Alq3 (200 Å)/LiF(10 Å)/Al(2000 Å).

An anode was manufactured by cutting an ITO glass substrate (15 Ω/cm², 1000 Å) to a size of 50 mm×50 mm×0.7 mm, ultrasonicating the cut substrate in acetone isopropyl alcohol and then in pure water for 15 minutes each, and performing UV-ozone washing on it for 30 minutes. PEDOT-PSS (Al4083, available from Bayer Co.) was coated on the substrate in the air at 110° C. for 15 minutes and then in nitrogen gas condition at 200° C. for 5 minutes to form a hole injecting layer having a thickness of 500 Å. A mixture of 0.1 g of the host compound 4 and 0.05 g of DPAVBi (5 parts by weight of the compound of Formula 101 based on 100 parts by weight of Compound 4) was spin-coated on the hole injecting layer and thermally treated at 100° C. for 30 minutes to form an emitting layer having a thickness of 480 Å. Next, Alq3 compound was vacuum-deposited on the emitting layer to a thickness of 200 Å to form an electron transporting layer. LiF and Al were sequentially vacuum-deposited on the electron transporting layer respectively to a thickness of 10 Å (electron injecting layer) and 2000 Å (cathode) to manufacture an organic light-emitting device as illustrated in FIG. 1A. This organic light-emitting device was referred to as Sample 1.

Example 2

An organic light-emitting device having a structure of ITO/PEDOT(500 Å)/Compound 4(480 Å)/Alq3(200 Å)/LiF(10 Å)/Al(2000 Å) was manufactured in the same manner as in Example 1, except that only Compound 4 was used as the host of the emitting layer without using a dopant. This organic light-emitting device was referred to as Sample 2.

Example 3

An organic light-emitting device having a structure of ITO/PEDOT(500 Å)/Compound 7+Dopant DPAVBi (480 Å)/Alq3(200 Å)/LiF(10 Å)/Al(2000 Å) was manufactured in the same manner as in Example 1, except that only Compound 7 instead of Compound 4 was used as the host. This organic light-emitting device was referred to as Sample 3.

Comparative Example 1

An organic light-emitting device having a structure of ITO/PEDOT(500 Å)/Compound 102+Dopant DPAVBi (480 Å)/Alq3(200 Å)/LiF(10 Å)/Al(2000 Å) was manufactured in the same manner as in Example 1, except that a compound of Formula 102 below instead of the compound of Formula 4 was used as the host. This organic light-emitting device was referred to as Sample 4.

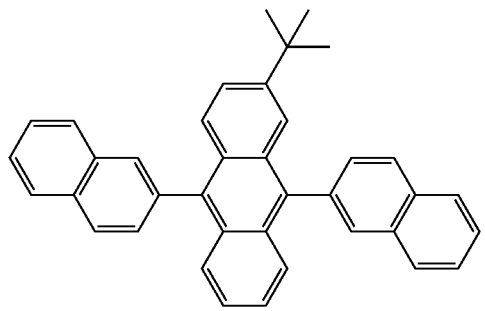

<Formula 102>

Evaluation Example 4

Characteristics Evaluation of Sample 1, 2, 3, and 4

Figure 3:
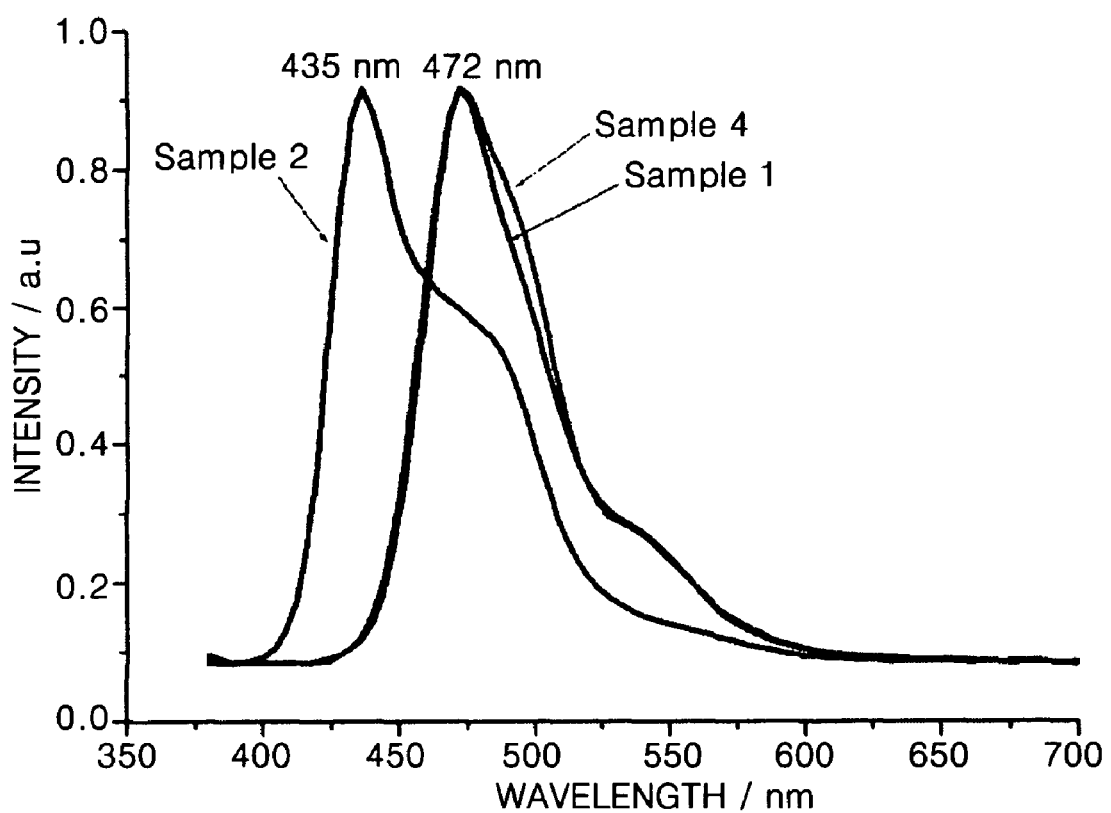
FIG. 3 is the luminescent spectra of organic light-emitting devices containing compounds according to embodiments of the present invention.

The turn-on voltages, color purities, and efficiencies of Samples 1, 2, 3, and 4 were measured using a PR650 (Spectroscan) source measurement unit. The results are shown in Table 4 below. The luminescence spectra of Samples 1, 2, and 4 are shown in FIG. 3.

TABLE 4

| Sample No. | Turn-on voltage (V) | CIE coordinates (~100 cd/m$^2$) | Efficiency (cd/A) |
|---|---|---|---|
| 1 | 3.2 | (0.15, 0.27) | 5.02 at 6.8 V |
| 2 | 3.6 | (0.15, 0.11) | 1.60 at 6 V |
| 3 | 3.4 | (0.15, 0.27) | 4.56 at 6.5 V |
| 4 | 3.4 | (0.15, 0.27) | 4.16 at 5.4 V |

Table 4 shows that Samples 1, 2, and 3 according to the embodiments of the present invention have excellent electrical characteristics.

Example 4

A glass substrate with an ITO transparent electrode (anode) having a thickness of 200 nm was washed by ultrasonication in a neutral detergent, distilled water, acetone, and ethanol for 15 minutes each. The glass substrate was dried using a nitrogen gas and treated with UV/ozone. Next, the substrate was fixed to a substrate holder in a deposition apparatus, and the pressure of the deposition apparatus was reduced to $3\times10^{-6}$ Torr for deposition. $MoO_3$ was deposited on the substrate at 0.1 nm/sec to a thickness of 10 nm to form a hole injecting layer. Next, α NPD was deposited on the hole injecting layer at 0.1 nm/sec to a thickness of 20 nm to form a hole transporting layer.

Next, Compound 4 and dopant DPAVBi were simultaneously deposited on the hole transporting layer at 3.0 nm/sec and 0.5 nm/sec, respectively, to form an emitting layer having a thickness of 20 nm.

Next, Alq3 was deposited on the emitting layer at 0.1 nm/sec to form an electron transporting layer having a thickness of 20 nm. Next, $CsCo_3$:BCP was co-deposited at 0.1 nm/sec to form an electron injecting layer having a thickness of 20 nm. Al was deposited at 0.1 nm/sec to form a cathode having a thickness of 200 nm, thereby resulting in an organic light-emitting device. This organic light-emitting device was referred to as Sample 5.

A DC voltage was applied to the organic light-emitting device, and the organic light-emitting device was continuously driven at a constant current of 1 mA at room temperature in a dry condition. The organic light-emitting device had a turn-on voltage of 3.6V and was found as a device emitting blue light with a luminance of 2,000 cd/m$_2$. The luminance was reduced by half in 3,500 hours.

Example 5

An organic light-emitting device was manufactured in the same manner as in Example 4, except that Compound 5 instead of Compound 4 was used to form the emitting layer. The organic light-emitting device was referred to as Sample 6 and was found as a device emitting blue light. The characteristics of the organic light-emitting device were measured. The results are shown in Table 5.

Example 6

An organic light-emitting device was manufactured in the same manner as in Example 4, except that Compound 7 instead of Compound 4 was used to form the emitting layer. The organic light-emitting device was referred to as Sample 7 and was found as a device emitting blue light. The characteristics of the organic light-emitting device were measured. The results are shown in Table 5.

Example 7

An organic light-emitting device was manufactured in the same manner as in Example 4, except that Compound 17 instead of Compound 4 was used to form the emitting layer. The organic light-emitting device was referred to as Sample 8 and was found as a device emitting blue light. The characteristics of the organic light-emitting device were measured. The results are shown in Table 5.

Example 8

An organic light-emitting device was manufactured in the same manner as in Example 4, except that Compound 55 instead of Compound 4 was used to form the emitting layer. The organic light-emitting device was referred to as Sample 9 and was found as a device emitting blue light. The characteristics of the organic light-emitting device were measured. The results are shown in Table 5.

Comparative Example 2

An organic light-emitting device was manufactured in the same manner as in Example 4, except that Compound 102 instead of Compound 4 was used to form the emitting layer. The organic light-emitting device was referred to as Sample 10 and was found as a device emitting blue light. The characteristics of the organic light-emitting device were measured. The results are shown in Table 5.

TABLE 5

| Sample No. | Turn-on voltage (V) | CIE coordinates (~100 cd/m$^2$) | Efficiency (cd/A@1000 nit) |
|---|---|---|---|
| 5 | 3.2 | (0.14, 0.20) | 7.58 |
| 6 | 3.6 | (0.15, 0.22) | 8.21 |
| 7 | 3.6 | (0.14, 0.22) | 7.36 |
| 8 | 3.4 | (0.15, 0.27) | 6.98 |
| 9 | 2.8 | (0.14, 0.19) | 7.15 |
| 10 | 4.0 | (0.16, 0.29) | 6.99 |

Table 5 shows that Samples 5 through 9 according to the embodiments of the present invention have excellent electrical characteristics.

As described above, the compound of Formula 1 according to the embodiment of the present invention has excellent solubility, excellent luminescent characteristics, and excellent thermal stability. An organic light-emitting device having a low turn-on voltage and excellent color purities can be manufactured using the compound of Formula 1.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting device comprising an organic layer containing an organic light-emitting compound represented by Formula 1:

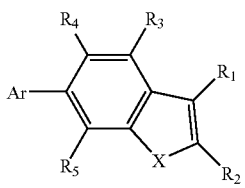

(1)

where Ar is a substituted or unsubstituted $C_{10}$-$C_{30}$ aryl group;

$R_1$ is independently selected from the group consisting of hydrogen, a halogen atom, a cyano group, a nitro group, a hydroxyl group, an unsubstituted $C_1$-$C_{20}$ alkyl group, a substituted or unsubstituted $C_1$-$C_{20}$ alkoxy group, a substituted or unsubstituted $C_5$-$C_{20}$ cycloalkyl group, a substituted or unsubstituted $C_5$-$C_{30}$ heterocycloalkyl group, a substituted or unsubstituted $C_6$-$C_{30}$ aryl group, —$N(Z_1)(Z_2)$, and —$Si(Z_3)(Z_4)(Z_5)$, wherein each of $Z_1$, $Z_2$, $Z_3$, $Z_4$, and $Z_5$ is independently selected from the group consisting of hydrogen, a substituted or unsubstituted $C_1$-$C_{20}$ alkyl group, a substituted or unsubstituted $C_6$-$C_{30}$ aryl group, a substituted or unsubstituted $C_2$-$C_{30}$ heteroaryl group, a substituted or unsubstituted $C_5$-$C_{20}$ cycloalkyl group, and a substituted or unsubstituted $C_5$-$C_{30}$ heterocycloalkyl group;

each of $R_3$, $R_4$, and $R_5$ is independently selected from the group consisting of hydrogen, a halogen atom, a cyano group, a nitro group, a hydroxyl group, a substituted or unsubstituted $C_1$-$C_{20}$ alkyl group, a substituted or unsubstituted $C_1$-$C_{20}$ alkoxy group, a substituted or unsubstituted $C_5$-$C_{20}$ cycloalkyl group, a substituted or unsubstituted $C_5$-$C_{30}$ heterocycloalkyl group, a substituted or unsubstituted $C_6$-$C_{30}$ aryl group, a substituted or unsubstituted $C_2$-$C_{30}$ heteroaryl group, —$N(Z_1)(Z_2)$, and —$Si(Z_3)(Z_4)(Z_5)$, wherein each of $Z_1$, $Z_2$, $Z_3$, $Z_4$, and $Z_5$ is independently selected from the group consisting of hydrogen, a substituted or unsubstituted $C_1$-$C_{20}$ alkyl group, a substituted or unsubstituted $C_6$-$C_{30}$ aryl group, a substituted or unsubstituted $C_2$-$C_{30}$ heteroaryl group, a substituted or unsubstituted $C_5$-$C_{20}$ cycloalkyl group, and a substituted or unsubstituted $C_5$-$C_{30}$ heterocycloalkyl group;

$R_2$ is independently selected from the group consisting of hydrogen, a halogen atom, a cyano group, a nitro group, a hydroxyl group, a substituted or unsubstituted $C_1$-$C_{20}$ alkyl group, a substituted or unsubstituted $C_1$-$C_{20}$ alkoxy group, a substituted or unsubstituted $C_5$-$C_{20}$ cycloalkyl group, a substituted or unsubstituted $C_5$-$C_{30}$ heterocycloalkyl group, a substituted or unsubstituted $C_6$-$C_{30}$ aryl group with the proviso that a substituent of the substituted C6-C50 aryl group is not an amino group, a substituted or unsubstituted $C_2$-$C_{30}$ heteroaryl group, —$N(Z_1)(Z_2)$, and —$Si(Z_3)(Z_4)(Z_5)$, wherein each of $Z_1$, $Z_2$, $Z_3$, $Z_4$, and $Z_5$ is independently selected from the group consisting of hydrogen, a substituted or unsubstituted $C_1$-$C_{20}$ alkyl group, a substituted or unsubstituted $C_6$-$C_{30}$ aryl group, a substituted or unsubstituted $C_2$-$C_{30}$ heteroaryl group, a substituted or unsubstituted $C_5$-$C_{20}$ cycloalkyl group, and a substituted or unsubstituted $C_5$-$C_{30}$ heterocycloalkyl group, and $R_2$ is not an anthracene group; and X is selected from the group consisting of $C(Z_6)(Z_7)$, $N(Z_8)$, O, S, $SO_2$, Se, and $SeO_2$ wherein each of $Z_6$ and $Z_7$ is independently a substituted or unsubstituted $C_1$-$C_{20}$ alkyl group, and $Z_8$ is independently hydrogen, or a substituted or unsubstituted $C_1$-$C_{20}$ alkyl group.

2. The organic light-emitting device of claim 1, being a compound represented by Formula 2:

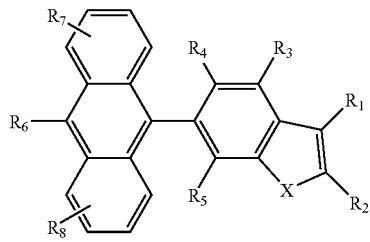

(2)

where $R_1$ is selected from the group consisting of hydrogen, a halogen atom, a cyano group, a hydroxyl group, an unsubstituted $C_1$-$C_{20}$ alkyl group, a substituted or unsubstituted $C_1$-$C_{20}$ alkoxy group, a substituted or unsubstituted $C_5$-$C_{20}$ cycloalkyl group, a substituted or unsubstituted $C_5$-$C_{30}$ heterocycloalkyl group, a substituted or unsubstituted $C_6$-$C_{30}$ aryl group, —$N(Z_2)(Z_2)$, and —$Si(Z_3)(Z_4)(Z_5)$, wherein each of $Z_1$, $Z_2$, $Z_3$, $Z_4$, and $Z_5$ is independently selected from the group consisting of hydrogen, a substituted or unsubstituted $C_1$-$C_{20}$ alkyl group, a substituted or unsubstituted $C_6$-$C_{30}$ aryl, a substituted or unsubstituted $C_2$-$C_{30}$ heteroaryl group, a substituted or unsubstituted $C_5$-$C_{20}$ cycloalkyl group, and a substituted or unsubstituted $C_5$-$C_{30}$ heterocycloalkyl group;

each of $R_3$, $R_4$, $R_5$, $R_6$, $R_7$, and $R_8$ is independently selected from the group consisting of hydrogen, a halogen atom, a cyano group, a hydroxyl group, a substituted or unsubstituted $C_1$-$C_{20}$ alkyl group, a substituted or unsubstituted alkoxy group, a substituted or unsubstituted $C_5$-$C_{20}$ cycloalkyl group, a substituted or unsubstituted $C_5$-$C_{30}$ heterocycloalkyl group, a substituted or unsubstituted $C_6$-$C_{30}$ aryl group, a substituted or unsubstituted $C_2$-$C_{30}$ heteroaryl group, —$N(Z_1)(Z_2)$, and —$Si(Z_3)(Z_4)(Z_5)$, wherein each of $Z_1$, $Z_2$, $Z_3$, $Z_4$, and $Z_5$ is independently selected from the group consisting of hydrogen, a substituted or unsubstituted $C_1$-$C_{20}$ alkyl group, a substituted or unsubstituted $C_6$-$C_{30}$ aryl, a substituted or unsubstituted $C_2$-$C_{30}$ heteroaryl group, a substituted or unsubstituted $C_5$-$C_{20}$ cycloalkyl group, and a substituted or unsubstituted $C_5$-$C_{30}$ heterocycloalkyl group;

$R_2$ is independently selected from the group consisting of hydrogen, a halogen atom, a cyano group, a nitro group, a hydroxyl group, a substituted or unsubstituted $C_1$-$C_{20}$ alkyl group, a substituted or unsubstituted $C_1$-$C_{20}$ alkoxy group, a substituted or unsubstituted $C_5$-$C_{20}$ cycloalkyl group, a substituted or unsubstituted $C_5$-$C_{30}$ heterocycloalkyl group, a substituted or unsubstituted $C_6$-$C_{30}$ aryl group with the proviso that a substituent of the substituted $C_6$-$C_{30}$ aryl group is not an amino group, a substituted or unsubstituted $C_2$-$C_{30}$ heteroaryl group, —$N(Z_1)(Z_2)$, and —$Si(Z_3)(Z_4)(Z_5)$, wherein each of $Z_1$, $Z_2$, $Z_3$, $Z_4$, and $Z_5$ is independently selected from the group consisting of hydrogen, a substituted or unsubstituted $C_1$-$C_{20}$ alkyl group, a substituted or unsubstituted $C_6$-$C_{30}$ aryl group, a substituted or unsubstituted $C_2$-$C_{30}$ heteroaryl group, a substituted or unsubstituted $C_5$-$C_{20}$ cycloalkyl group, and a substituted or unsubstituted $C_5$-$C_{30}$ heterocycloalkyl group, and $R_2$ is not an anthracene group; and X is selected from the group consisting of $C(Z_6)(Z_7)$, $N(Z_8)$, O, S, $SO_2$, Se, and $SeO_2$ wherein each of $Z_6$ and $Z_7$ is independently a substituted or unsubstituted $C_1$-$C_{20}$ alkyl group, and $Z_8$ is independently hydrogen, or a substituted or unsubstituted $C_1$-$C_{20}$ alkyl group.

3. The organic light-emitting device of claim 1, being a compound represented by Formula 3:

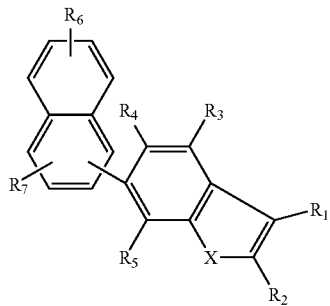

(3)

where $R_1$ is selected from the group consisting of hydrogen, a halogen atom, a cyano group, a hydroxyl group, an unsubstituted $C_1$-$C_{20}$ alkyl group, a substituted or unsubstituted $C_1$-$C_{20}$ alkoxy group, a substituted or unsubstituted $C_5$-$C_{20}$ cycloalkyl group, a substituted or unsubstituted $C_5$-$C_{30}$ heterocycloalkyl group, a substituted or unsubstituted $C_6$-$C_{30}$ aryl group, $-N(Z_1)(Z_2)$, and $-Si(Z_3)(Z_4)(Z_5)$, wherein each of $Z_1$, $Z_2$, $Z_3$, $Z_4$, and $Z_5$ is independently selected from the group consisting of hydrogen, a substituted or unsubstituted $C_1$-$C_{20}$ alkyl group, a substituted or unsubstituted $C_6$-$C_{30}$ aryl group, a substituted or unsubstituted $C_2$-$C_{30}$ heteroaryl group, a substituted or unsubstituted $C_5$-$C_{20}$ cycloalkyl group, and a substituted or unsubstituted $C_5$-$C_{30}$ heterocycloalkyl group;

each of $R_3$, $R_4$, $R_5$, $R_6$, and $R_7$ is independently selected from the group consisting of hydrogen, a halogen atom, a cyano group, a hydroxyl group, a substituted or unsubstituted $C_1$-$C_{20}$ alkyl group, a substituted or unsubstituted $C_1$-$C_{20}$ alkoxy group, a substituted or unsubstituted $C_5$-$C_{20}$ cycloalkyl group, a substituted or unsubstituted $C_5$-$C_{30}$ heterocycloalkyl group, a substituted or unsubstituted $C_6$-$C_{30}$ aryl group, a substituted or unsubstituted $C_2$-$C_{30}$ heteroaryl group, $-N(Z_1)(Z_2)$, and $-Si(Z_3)(Z_4)(Z_5)$, wherein each of $Z_1$, $Z_2$, $Z_3$, $Z_4$, and $Z_5$ is independently selected from the group consisting of hydrogen, a substituted or unsubstituted $C_1$-$C_{20}$ alkyl group, a substituted or unsubstituted $C_6$-$C_{30}$ aryl group, a substituted or unsubstituted $C_2$-$C_{30}$ heteroaryl group, a substituted or unsubstituted $C_5$-$C_{20}$ cycloalkyl group, and a substituted or unsubstituted $C_5$-$C_{30}$ heterocycloalkyl group;

$R_2$ is independently selected from the group consisting of hydrogen, a halogen atom, a cyano group, a nitro group, a hydroxyl group, a substituted or unsubstituted $C_1$-$C_{20}$ alkyl group, a substituted or unsubstituted $C_1$-$C_{20}$ alkoxy group, a substituted or unsubstituted $C_5$-$C_{20}$ cycloalkyl group, a substituted or unsubstituted $C_5$-$C_{30}$ heterocycloalkyl group, a substituted or unsubstituted $C_6$-$C_{30}$ aryl group with the proviso that a substituent of the $C_6$-$C_{30}$ aryl group is not an amino group, a substituted or unsubstituted $C_2$-$C_{30}$ heteroaryl group, $-N(Z_1)(Z_2)$, and $-Si(Z_3)(Z_4)(Z_5)$, wherein each of $Z_1$, $Z_2$, $Z_3$, $Z_4$, and $Z_5$ is independently selected from the group consisting of hydrogen, a substituted or unsubstituted $C_1$-$C_{20}$ alkyl group, a substituted or unsubstituted $C_6$-$C_{30}$ aryl group, a substituted or unsubstituted $C_2$-$C_{30}$ heteroaryl group, a substituted or unsubstituted $C_5$-$C_{20}$ cycloalkyl group, and a substituted or unsubstituted $C_5$-$C_{30}$ heterocycloalkyl group, and $R_2$ is not an anthracene group; and X is selected from the group consisting of $C(Z_6)(Z_7)$, $N(Z_8)$, O, S, $SO_2$, Se, and $SeO_2$ wherein each of $Z_6$ and $Z_7$ is independently a substituted or unsubstituted $C_1$-$C_{20}$ alkyl group, and $Z_8$ is independently hydrogen, or a substituted or unsubstituted $C_1$-$C_{20}$ alkyl group.

4. The organic light-emitting device of claim 1, wherein each of the substituted alkyl group, the substituted alkoxy group, the substituted aryl group, the substituted heteroaryl group, the substituted cycloalkyl group, and the substituted heterocycloalkyl group has at least one substituent selected from the group consisting of —F; —Cl; —Br; —CN; —NO$_2$; —OH; an unsubstituted $C_1$-$C_{20}$ alkyl group or a $C_1$-$C_{20}$ alkyl group substituted with —F, —Cl, —Br, —CN, —NO$_2$, or —OH; an unsubstituted $C_1$-$C_{20}$ alkoxy group or a $C_1$-$C_{20}$ alkoxy group substituted with —F, —Cl, —Br, —CN, —NO$_2$, or —OH; an unsubstituted $C_6$-$C_{30}$ aryl group or a $C_6$-$C_{30}$ aryl group substituted with a $C_1$-$C_{20}$ alkyl group, a $C_1$-$C_{20}$ alkoxy group, —F, —Cl, —Br, —CN, —NO$_2$, or —OH; an unsubstituted $C_2$-$C_{30}$ heteroaryl group or a $C_2$-$C_{30}$ heteroaryl group substituted with a $C_1$-$C_{20}$ alkyl group, a $C_1$-$C_{20}$ alkoxy group, —F, —Cl, —Br, —CN, —NO$_2$, or —OH; an unsubstituted $C_5$-$C_{20}$ cycloalkyl group or a $C_5$-$C_{20}$ cycloalkyl group substituted with a $C_1$-$C_{20}$ alkyl group, a $C_1$-$C_{20}$ alkoxy group, —F, —Cl, —Br, —CN, —NO$_2$, or —OH; an unsubstituted $C_5$-$C_{30}$ heterocycloalkyl group or a $C_5$-$C_{30}$ heterocycloalkyl group substituted with a $C_1$-$C_{20}$ alkyl group, a $C_1$-$C_{20}$ alkoxy group, —F, —Cl, —Br, —CN, —NO$_2$, or —OH; and —N($Z_9$)($Z_{10}$), wherein each of $Z_9$ and $Z_{10}$ is independently selected from the group consisting of hydrogen, a $C_1$-$C_{10}$ alkyl group; and a $C_6$-$C_{30}$ aryl group substituted with a $C_1$-$C_{10}$ alkyl group.

5. The organic light-emitting device of claim 1, wherein each of $R_2$, $R_3$, $R_4$, and $R_5$ is independently selected from the group consisting of hydrogen, a $C_1$-$C_{10}$ alkyl group, a $C_1$-$C_{10}$ alkoxy group, a phenyl group, a biphenyl group, a pentalenyl group, an indenyl group, a naphthyl group, a biphenylenyl group, an anthracenyl group, an azulenyl group, a heptalenyl group, an acenaphthylenyl group, a phenalenyl group, a fluorenyl group, a methylanthryl group, a phenanthrenyl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, a carbazolyl group, a thiophenyl group, an indolyl group, a purinyl group, a benzimidazolyl group, a quinolinyl group, a benzothiophenyl group, a parathiazinyl group, a pyrrolyl group, a pyrazolyl group, an imidazolyl group, an imidazolinyl group, an oxazolyl group, a thiazolyl group, a triazolyl group, a tetrazolyl group, an oxadiazolyl group, a pyridinyl group, a pyridazinyl group, a pyrimidinyl group, a pyrazinyl group, a thianthrenyl group, a cyclopentyl group, a cyclohexyl group, an oxiranyl group, a pyrrolidinyl group, a pyrazolidinyl group, an imidazolidinyl group, a piperidinyl group, a pyrazinyl group, a morpholinyl group, a di($C_6$-$C_{30}$ aryl)amino group, a tri($C_6$-$C_{30}$ aryl)silyl group, and a derivative thereof.

6. The organic light-emitting device of claim 1, wherein each of $R_2$, $R_3$, $R_4$, and $R_5$ is independently selected from the group consisting of a methyl group, a methoxy group, a phenyl group, a tolyl group, a naphthyl group, a pyrenyl group, a phenanthrenyl group, a fluorenyl group, an imidazolinyl group, an indolyl group, a quinolinyl group, a diphenylamino group, a 2,3-di-p-tolylaminophenyl group, a triphenylsilyl group, and a derivative thereof.

7. The organic light-emitting compound of claim 1, where X is one of N—$CH_3$, O, and S.

8. The organic light-emitting device of claim 1, wherein the organic light-emitting compound is one of compounds represented by the following Formulas:

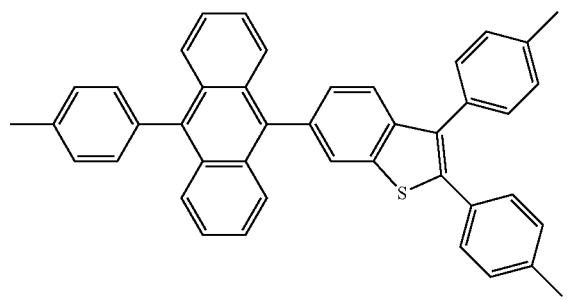

<Formula 4>

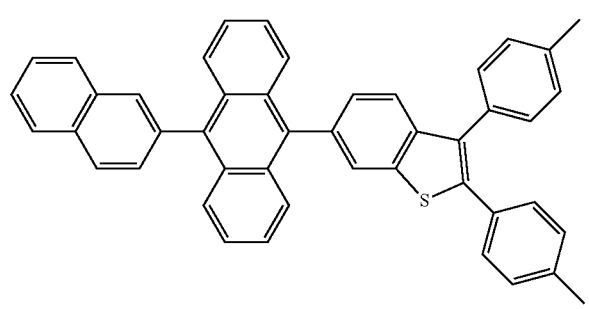

<Formula 5>

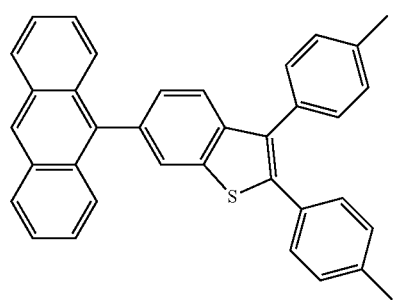

<Formula 7>

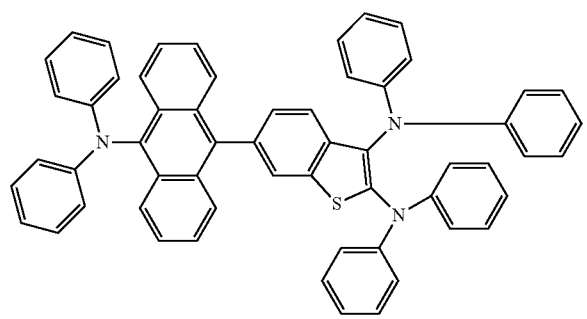

<Formula 12>

<Formula 14>
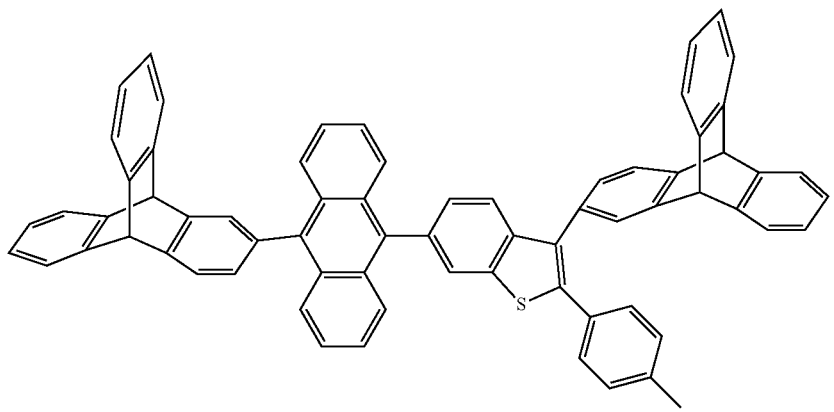
<Formula 15>
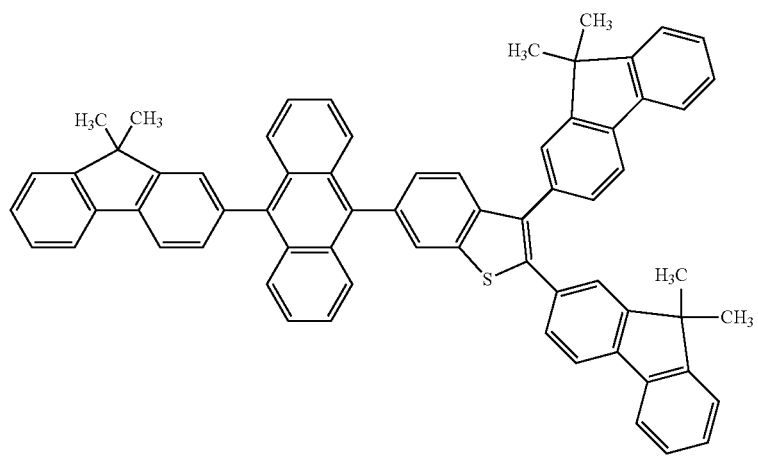
<Formula 23>
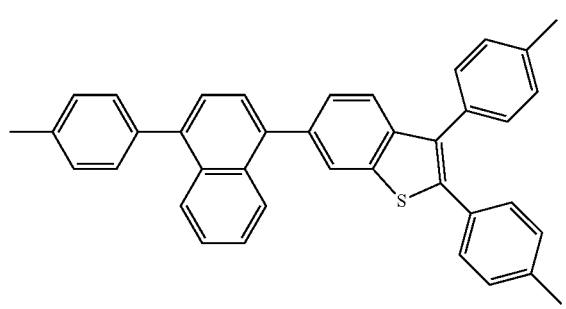
<Formula 29>
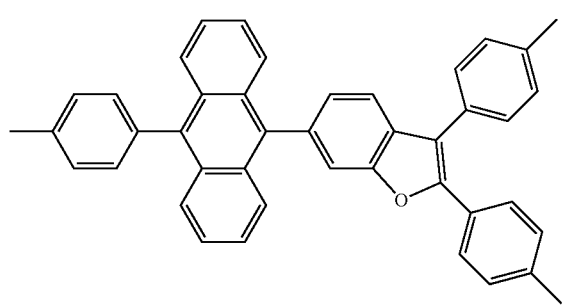

-continued

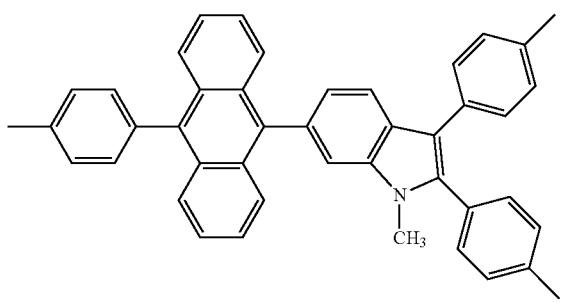
<Formula 55>

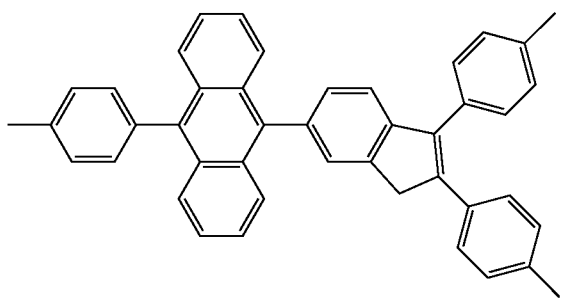
<Formula 81>

9. An organic light-emitting device comprising:
a first electrode;
a second electrode; and
at least one organic layer interposed between the first electrode and the second electrode, said at least one organic, layer containing a compound represented by Formula 1:

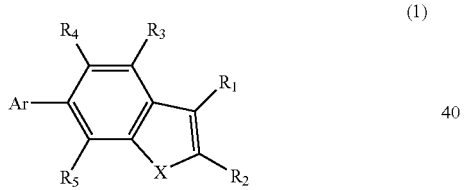
(1)

where Ar is a substituted or unsubstituted $C_6$-$C_{30}$ aryl group;
$R_1$ is independently selected from the group consisting of hydrogen, a halogen atom, a cyano group, a nitro group, a hydroxyl group, an unsubstituted $C_1$-$C_{20}$ alkyl group, a substituted or unsubstituted $C_1$-$C_{20}$ alkoxy group, a substituted or unsubstituted $C_5$-$C_{20}$ cycloalkyl group, a substituted or unsubstituted $C_5$-$C_{30}$ heterocycloalkyl group, a substituted or unsubstituted $C_6$-$C_{30}$ aryl group, —N($Z_1$)($Z_2$), and —Si($Z_3$)($Z_4$)($Z_5$), wherein each of $Z_1$, $Z_2$, $Z_3$, $Z_4$, and $Z_5$ is independently selected from the group consisting of hydrogen, a substituted or unsubstituted $C_1$-$C_{20}$ alkyl group, a substituted or unsubstituted $C_6$-$C_{30}$ aryl group, a substituted or unsubstituted $C_2$-$C_{30}$ heteroaryl group, a substituted or unsubstituted $C_5$-$C_{20}$ cycloalkyl group, and a substituted or unsubstituted $C_5$-$C_{30}$ heterocycloalkyl group;
each of $R_3$, $R_4$, and $R_5$ is independently selected from the group consisting of hydrogen, a halogen atom, a cyano group, a nitro group, a hydroxyl group, a substituted or unsubstituted $C_1$-$C_{20}$ alkyl group, a substituted or unsubstituted $C_1$-$C_{20}$ alkoxy group, a substituted or unsubstituted $C_5$-$C_{20}$ cycloalkyl group, a substituted or unsubstituted $C_5$-$C_{30}$ heterocycloalkyl group, a substituted or unsubstituted $C_6$-$C_{30}$ aryl group, a substituted or unsubstituted $C_2$-$C_{30}$ heteroaryl group, —N($Z_1$)($Z_2$), and —Si($Z_3$)($Z_4$)($Z_5$), wherein each of $Z_1$, $Z_2$, $Z_3$, $Z_4$, and $Z_5$ is independently selected from the group consisting of hydrogen, a substituted or unsubstituted $C_1$-$C_{20}$ alkyl group, a substituted or unsubstituted $C_6$-$C_{30}$ aryl group, a substituted or unsubstituted $C_2$-$C_{30}$ heteroaryl group, a substituted or unsubstituted $C_5$-$C_{20}$ cycloalkyl group, and a substituted or unsubstituted $C_5$-$C_{30}$ heterocycloalkyl group;
$R_2$ is independently selected from the group consisting of hydrogen, a halogen atom, a cyano group, a nitro group, a hydroxyl group, a substituted or unsubstituted $C_1$-$C_{20}$ alkyl group, a substituted or unsubstituted $C_1$-$C_{20}$ alkoxy group, a substituted or unsubstituted $C_5$-$C_{20}$ cycloalkyl group, a substituted or unsubstituted $C_5$-$C_{30}$ heterocycloalkyl group, a substituted or unsubstituted $C_6$-$C_{30}$ aryl group with the proviso that a substituent of the substituted $C_6$-$C_{50}$ aryl group is not an amino group, a substituted or unsubstituted $C_2$-$C_{30}$ heteroaryl group, —N($Z_1$)($Z_2$), and —Si($Z_3$)($Z_4$)($Z_5$), wherein each of $Z_1$, $Z_2$, $Z_3$, $Z_4$, and $Z_5$ is independently selected from the group consisting of hydrogen, a substituted or unsubstituted $C_1$-$C_{20}$ alkyl group, a substituted or unsubstituted $C_6$-$C_{30}$ aryl group, a substituted or unsubstituted $C_2$-$C_{30}$ heteroaryl group, a substituted or unsubstituted $C_5$-$C_{20}$ cycloalkyl group, and a substituted or unsubstituted $C_5$-$C_{30}$ heterocycloalkyl group, and $R_2$ is not an anthracene group; and
X is selected from the group consisting of C($Z_6$)($Z_7$), N($Z_8$), O, S, $SO_2$, Se, and $SeO_2$ wherein each of $Z_6$, $Z_7$, and $Z_8$ is independently hydrogen, a substituted or unsubstituted $C_1$-$C_{20}$ alkyl group.

10. The organic light-emitting device of claim 9, wherein the compound is represented by Formula 2:

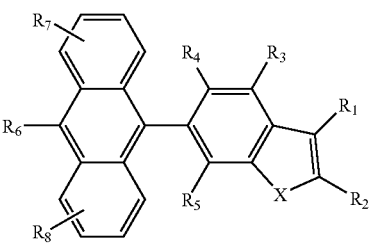

(2)

where $R_1$ is selected from the group consisting of hydrogen, a halogen atom, a cyano group, a hydroxyl group, an unsubstituted $C_1$-$C_{20}$ alkyl group, a substituted or unsubstituted $C_1$-$C_{20}$ alkoxy group, a substituted or unsubstituted $C_5$-$C_{20}$ cycloalkyl group, a substituted or unsubstituted $C_5$-$C_{30}$ heterocycloalkyl group, a substituted or unsubstituted $C_6$-$C_{30}$ aryl group, —$N(Z_1)(Z_2)$, and —$Si(Z_3)(Z_4)(Z_5)$, wherein each of $Z_1$, $Z_2$, $Z_3$, $Z_4$, and $Z_5$ is independently selected from the group consisting of hydrogen, a substituted or unsubstituted $C_1$-$C_{20}$ alkyl group, a substituted or unsubstituted $C_6$-$C_{30}$ aryl, a substituted or unsubstituted $C_2$-$C_{30}$ heteroaryl group, a substituted or unsubstituted $C_5$-$C_{20}$ cycloalkyl group, and a substituted or unsubstituted $C_5$-$C_{30}$ heterocycloalkyl group;

each of $R_3$, $R_4$, $R_5$, $R_6$, $R_7$, and $R_8$ is independently group hydrogen, a halogen atom, a cyano group, a hydroxyl group, a substituted or unsubstituted $C_1$-$C_{20}$ alkyl group, a substituted or unsubstituted $C_1$-$C_{20}$ alkoxy group, a substituted or unsubstituted $C_5$-$C_{20}$ cycloalkyl group, a substituted or unsubstituted $C_5$-$C_{30}$ heterocycloalkyl group, a substituted or unsubstituted $C_6$-$C_{30}$ aryl group, a substituted or unsubstituted $C_2$-$C_{30}$ heteroaryl group, —$N(Z_1)(Z_2)$, and —$Si(Z_3)(Z_4)(Z_5)$, wherein each of $Z_1$, $Z_2$, $Z_3$, $Z_4$, and $Z_5$ is independently selected from the group consisting of hydrogen, a substituted or unsubstituted $C_1$-$C_{20}$ alkyl group, a substituted or unsubstituted $C_6$-$C_{30}$ aryl, a substituted or unsubstituted $C_2$-$C_{30}$ heteroaryl group, a substituted or unsubstituted $C_5$-$C_{20}$ cycloalkyl group, and a substituted or unsubstituted $C_5$-$C_{30}$ heterocycloalkyl group;

$R_2$ is independently selected from the group consisting of hydrogen, a halogen atom, a cyano group, a nitro group, a hydroxyl group, a substituted or unsubstituted $C_1$-$C_{20}$ alkyl group, a substituted or unsubstituted $C_1$-$C_{20}$ alkoxy group, a substituted or unsubstituted $C_5$-$C_{20}$ cycloalkyl group, a substituted or unsubstituted $C_5$-$C_{30}$ heterocycloalkyl group, a substituted or unsubstituted $C_6$-$C_{30}$ aryl group with the proviso that a substituent of the substituted $C_6$-$C_{30}$ aryl group is not an amino group, a substituted or unsubstituted $C_2$-$C_{30}$ heteroaryl group, —$N(Z_1)(Z_2)$, and —$Si(Z_3)(Z_4)(Z_5)$, wherein each of $Z_1$, $Z_2$, $Z_3$, $Z_4$, and $Z_5$ is independently selected from the group consisting of hydrogen, a substituted or unsubstituted $C_1$-$C_{20}$ alkyl group, a substituted or unsubstituted $C_6$-$C_{30}$ aryl group, a substituted or unsubstituted $C_2$-$C_{30}$ heteroaryl group, a substituted or unsubstituted $C_5$-$C_{20}$ cycloalkyl group, and a substituted or unsubstituted $C_5$-$C_{30}$ heterocycloalkyl group, and $R_2$ is not an anthracene group; and X is selected from the group consisting of $C(Z_6)(Z_7)$, $N(Z_8)$, O, S, $SO_2$, Se, and $SeO_2$ wherein each of $Z_6$, $Z_7$, and $Z_8$ is independently hydrogen, a substituted or unsubstituted $C_1$-$C_{20}$ alkyl group.

11. The organic light-emitting device of claim 9, wherein the compound is represented by Formula 3:

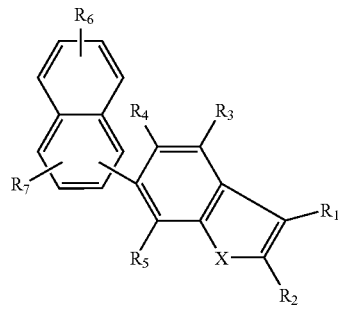

(3)

where $R_1$ is selected from the group consisting of hydrogen, a halogen atom, a cyano group, a hydroxyl group, an unsubstituted $C_1$-$C_{20}$ alkyl group, a substituted or unsubstituted $C_1$-$C_{20}$ alkoxy group, a substituted or unsubstituted $C_5$-$C_{20}$ cycloalkyl group, a substituted or unsubstituted $C_5$-$C_{30}$ heterocycloalkyl group, a substituted or unsubstituted $C_6$-$C_{30}$ aryl group, —$N(Z_1)(Z_2)$, and —$Si(Z_3)(Z_4)(Z_5)$, wherein each of $Z_1$, $Z_2$, $Z_3$, $Z_4$, and $Z_5$ is independently selected from the group consisting of hydrogen, a substituted or unsubstituted $C_1$-$C_{20}$ alkyl group, a substituted or unsubstituted $C_6$-$C_{30}$ aryl group, a substituted or unsubstituted $C_2$-$C_{30}$ heteroaryl group, a substituted or unsubstituted $C_5$-$C_{20}$ cycloalkyl group, and a substituted or unsubstituted $C_5$-$C_{30}$ heterocycloalkyl group;

each of $R_3$, $R_4$, $R_5$, $R_6$, and $R_7$ is independently selected from the group consisting of hydrogen, a halogen atom, a cyano group, a hydroxyl group, a substituted or unsubstituted $C_1$-$C_{20}$ alkyl group, a substituted or unsubstituted $C_1$-$C_{20}$ alkoxy group, a substituted or unsubstituted $C_5$-$C_{20}$ cycloalkyl group, a substituted or unsubstituted $C_5$-$C_{30}$ heterocycloalkyl group, a substituted or unsubstituted $C_6$-$C_{30}$ aryl group, a substituted or unsubstituted $C_2$-$C_{30}$ heteroaryl group, —$N(Z_1)(Z_2)$, and —$Si(Z_3)(Z_4)(Z_5)$, wherein each of $Z_1$, $Z_2$, $Z_3$, $Z_4$, and $Z_5$ is independently selected from the group consisting of hydrogen, a substituted or unsubstituted $C_1$-$C_{20}$ alkyl group, a substituted or unsubstituted $C_6$-$C_{30}$ aryl group, a substituted or unsubstituted $C_2$-$C_{30}$ heteroaryl group, a substituted or unsubstituted $C_5$-$C_{20}$ cycloalkyl group, and a substituted or unsubstituted $C_5$-$C_{30}$ heterocycloalkyl group;

$R_2$ is independently selected from the group consisting of hydrogen, a halogen atom, a cyano group, a nitro group, a hydroxyl group, a substituted or unsubstituted $C_1$-$C_{20}$ alkyl group, a substituted or unsubstituted $C_1$-$C_{20}$ alkoxy group, a substituted or unsubstituted $C_5$-$C_{20}$ cycloalkyl group, a substituted or unsubstituted $C_5$-$C_{50}$ heterocycloalkyl group, a substituted or unsubstituted $C_6$-$C_{30}$ aryl group with the proviso that a substituent of the substituted $C_6$-$C_{30}$ aryl group is not an amino group, a substituted or unsubstituted $C_2$-$C_{30}$ heteroaryl group, —$N(Z_1)(Z_2)$, and —$Si(Z_3)(Z_4)(Z_5)$, wherein each of $Z_1$, $Z_2$, $Z_3$, $Z_4$, and $Z_5$ is independently selected from the group consisting of hydrogen, a substituted or unsubstituted $C_1$-$C_{20}$ alkyl group, a substituted or unsubstituted $C_6$-$C_{30}$ aryl group, a substituted or unsubstituted $C_2$-$C_{30}$ heteroaryl group, a substituted or unsubstituted $C_5$-$C_{20}$ cycloalkyl group, and a substituted or unsubstituted $C_5$-$C_{30}$ heterocycloalkyl group, and $R_2$ is not an anthracene group; and X is selected from the group consisting of $C(Z_6)(Z_7)$, $N(Z_8)$, O, S, $SO_2$, Se, and $SeO_2$ wherein each of $Z_6$, $Z_7$, and $Z_8$ is independently hydrogen, a substituted or unsubstituted $C_1$-$C_{20}$ alkyl group.

12. The organic light-emitting device of claim 9, wherein each of the substituted alkyl group, the substituted alkoxy group, the substituted aryl group, the substituted heteroaryl group, the substituted cycloalkyl group, and the substituted heterocycloalkyl group has at least one substituent selected from the group consisting of —F; —Cl; —Br; —CN; —NO$_2$; —OH; an unsubstituted $C_1$-$C_{20}$ alkyl group or a $C_1$-$C_{20}$ alkyl group substituted with —F, —Br, —CN, —NO$_2$, or —OH; an unsubstituted $C_1$-$C_{20}$ alkoxy group or a $C_1$-$C_{20}$ alkoxy group substituted with —F, —Cl, —Br, —CN, —NO$_2$, or —OH; an unsubstituted $C_6$-$C_{30}$ aryl group or a $C_6$-$C_{30}$ aryl group substituted with a $C_1$-$C_{20}$ alkyl group, a $C_1$-$C_{20}$ alkoxy group, —F, —Cl, —Br, —CN, —NO$_2$, or —OH; an unsubstituted $C_2$-$C_{30}$ heteroaryl group or a $C_2$-$C_{30}$ heteroaryl group substituted with a $C_1$-$C_{20}$ alkyl group, a $C_1$-$C_{20}$ alkoxy group, —F, —Cl, —Br, —CN, —NO$_2$, or —OH; an unsubstituted $C_5$-$C_{20}$ cycloalkyl group or a $C_5$-$C_{20}$ cycloalkyl group substituted with a $C_1$-$C_{20}$ alkyl group, a $C_1$-$C_{20}$ alkoxy group, —F, —Cl, —Br, —CN, —NO$_2$, or —OH; an unsubstituted $C_5$-$C_{30}$ heterocycloalkyl group or a $C_5$-$C_{30}$ heterocycloalkyl group substituted with a $C_1$-$C_{20}$ alkyl group, a $C_1$-$C_{20}$ alkoxy group, —F, —Cl, —Br, —CN, —NO$_2$, or —OH; and —N($Z_9$)($Z_{10}$), wherein each of $Z_9$ and $Z_{10}$ is independently selected from the group consisting of hydrogen, a $C_1$-$C_{20}$ alkyl group; and a $C_6$-$C_{30}$ aryl group substituted with a $C_1$-$C_{20}$ alkyl group.

13. The organic light-emitting device of claim 9, wherein each of $R_2$, $R_3$, $R_4$, and $R_5$ is independently selected from the group consisting of hydrogen, a $C_1$-$C_{20}$ alkyl group, a $C_1$-$C_{20}$ alkoxy group, a phenyl group, a biphenyl group, a pentalenyl group, an indenyl group, a naphthyl group, a biphenylenyl group, an anthracenyl group, an azulenyl group, a heptalenyl group, an acenaphthylenyl group, a phenalenyl group, a fluorenyl group, a methylanthryl group, a phenanthrenyl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, a carbazolyl group, a thiophenyl group, an indolyl group, a purinyl group, a benzimidazolyl group, a quinolinyl group, a benzothiophenyl group, a parathiazinyl group, a pyrrolyl group, a pyrazolyl group, an imidazolyl group, an imidazolinyl group, an oxazolyl group, a thiazolyl group, a triazolyl group, a tetrazolyl group, an oxadiazolyl group, a pyridinyl group, a pyridazinyl group, a pyrimidinyl group, a pyrazinyl group, a thianthrenyl group, a cyclopentyl group, a cyclohexyl group, an oxiranyl group, a pyrrolidinyl group, a pyrazolidinyl group, an imidazolidinyl group, a piperidinyl group, a pyrazinyl group, a morpholinyl group, a di($C_6$-$C_{30}$ aryl) amino group, a tri($C_6$-$C_{30}$ aryl)silyl group, and a derivative thereof.

14. The organic light-emitting device of claim 9, wherein said at least one organic layer containing the compound represented by Formula 1 is at least one of an emitting layer, a hole injecting layer, and a hole transporting layer.

15. The organic light-emitting device of claim 9, wherein the compound represented by Formula 1 is a host material of said at least one organic layer.

16. The organic light-emitting device of claim 9, wherein the compound represented by Formula 1 is a dopant material of said at least one organic layer.

17. The organic light-emitting device of claim 9, further comprising at least one layer selected from the group consisting of a hole injecting layer, a hole transporting layer, an electron blocking layer, a hole blocking layer, an electron transporting layer, and an electron injecting layer.

18. The organic light-emitting device of claim 17, having a structure including a first electrode, a hole injecting layer, an emitting layer, an electron transporting layer, an electron injecting layer, and a second electrode which are sequentially stacked, a structure including a first electrode, a hole injecting layer, a hole transporting layer, an emitting layer, an electron transporting layer, an electron injecting layer, and a second electrode which are sequentially stacked, or a structure including a first electrode, a hole injecting layer, a hole transporting layer, an emitting layer, a hole blocking layer, an electron transporting layer, an electron injecting layer, and a second electrode which are sequentially stacked.

19. An organic light-emitting device comprising:
a first electrode;
a second electrode; and
at least one organic layer interposed between the first electrode and the second electrode, said at least one organic layer containing the compound represented by Formula 2 or 3:

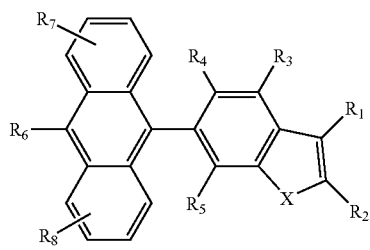

(2)

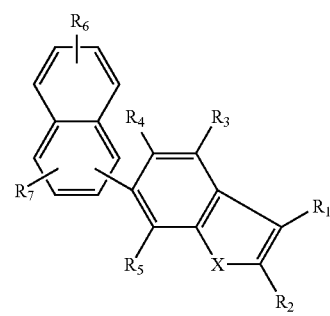

(3)

where $R_1$ is selected from the group consisting of a methoxy group, a phenyl group, a tolyl group, a naphthyl group, a pyrenyl group, a phenanthrenyl group, a fluorenyl group, an indolyl group, a quinolinyl group, a diphenylamino group, a 2,3-di-p-tolylaminophenyl group, a triphenylsilyl group, and a derivative thereof;

each of $R_2$, $R_3$, $R_4$, $R_5$, $R_6$, $R_7$, and $R_8$ is independently selected from the group consisting of a methyl group, a methoxy group, a phenyl group, a tolyl group, a naphthyl group, a pyrenyl group, a phenanthrenyl group, a fluorenyl group, an imidazolinyl group, an indolyl group, a quinolinyl group, a diphenylamino group, a 2,3-di-p-tolylaminophenyl group, a triphenylsilyl group, and a derivative thereof; and X is one of N—CH$_3$, O, and S.

* * * * *